(12) United States Patent
Aoyama et al.

(10) Patent No.: US 8,759,205 B2
(45) Date of Patent: Jun. 24, 2014

(54) SEMICONDUCTOR DEVICE AND METHOD FOR MANUFACTURING SEMICONDUCTOR DEVICE

(75) Inventors: Tomonori Aoyama, Yokohama (JP); Yusuke Oshiki, Yokohama (JP); Kiyotaka Miyano, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 333 days.

(21) Appl. No.: 12/883,463

(22) Filed: Sep. 16, 2010

(65) Prior Publication Data

US 2011/0215333 A1 Sep. 8, 2011

(30) Foreign Application Priority Data

Mar. 3, 2010 (JP) ................................. 2010-047014

(51) Int. Cl.
*H01L 29/66* (2006.01)
*H01L 21/20* (2006.01)

(52) U.S. Cl.
USPC ............. 438/483; 438/166; 438/487; 257/65; 257/66; 257/75; 257/E21.09; 257/E21.133; 257/E29.003; 257/E29.166

(58) Field of Classification Search
USPC ................. 438/166, 483, 487; 257/65, 66, 67
See application file for complete search history.

(56) References Cited

U.S. PATENT DOCUMENTS

| 5,456,762 | A | * | 10/1995 | Kariya et al. ................. 136/258 |
| 5,599,403 | A | * | 2/1997 | Kariya et al. ................. 136/258 |
| 5,959,314 | A | * | 9/1999 | Voutsas ........................... 257/65 |
| 6,162,711 | A | * | 12/2000 | Ma et al. ........................ 438/558 |
| 6,528,361 | B1 | * | 3/2003 | Ahn et al. ...................... 438/166 |
| 2007/0105352 | A1 | * | 5/2007 | Gu et al. ....................... 438/487 |

FOREIGN PATENT DOCUMENTS

| JP | 61-43417 | 3/1986 |
| JP | 62-229924 | 10/1987 |
| JP | 7-38118 | 2/1995 |
| JP | 7-142405 | 6/1995 |
| JP | 7-335545 | 12/1995 |
| JP | 8-316143 | 11/1996 |
| JP | 2002-280304 | 9/2002 |
| JP | 2006-135149 | 5/2006 |
| JP | 2008-243965 | 10/2008 |
| JP | 2009-4629 | 1/2009 |
| JP | 2009-218524 | 9/2009 |

OTHER PUBLICATIONS

First Office Action issued by the Japanese Patent Office on May 28, 2013, in counterpart Japanese Application No. 2010-047014.

(Continued)

*Primary Examiner* — Matthew W Such
*Assistant Examiner* — David Spalla
(74) *Attorney, Agent, or Firm* — Finnegan, Henderson, Farabow, Garrett & Dunner, LLP

(57) ABSTRACT

According to one embodiment, a method for manufacturing a semiconductor device, wherein an amorphous semiconductor film comprising a microcrystal is annealed using a microwave, to crystallize the amorphous semiconductor film comprising the microcrystal using the microcrystal as a nucleus.

15 Claims, 20 Drawing Sheets

(56) References Cited

OTHER PUBLICATIONS

First Office Action issued by the Japanese Patent Office on Jul. 31, 2012, for Japanese Patent Application No. 2010-047014, and English-language translation thereof.

T. Aoyama, "Method and Apparatus for Manufacturing Semiconductor Device," U.S. Appl. No. 12/831,604, filed Jul. 7, 2010.

V. Subramanian et al., "High-Performance Germanium-Seeded Laterally Crystallized TFT's for Vertical Device Integration," IEEE Transactions on Electron Devices, vol. 45, No. 9, pp. 1934-1939 (Sep. 1998).

K. Yasutake et al., "Size and Density Control of Crystalline Ge Islands on Glass Substrates by Oxygen Etching," Japanese Journal of Applied Physics, vol. 43, No. 12A, pp. L1552-L1554 (2004).

C. Yoshimoto et al., "Formation of Polycrystalline Si Thin Films Using Nanocrystalline Ge Nuclei," The Institute of Electronics, Information and Communication Engineers Technical Report, vol. 108, No. 1, pp. 89-93 (Apr. 2008).

Aoyama et al., U.S. Appl. No. 13/017,498, filed Jan. 31, 2011.

* cited by examiner

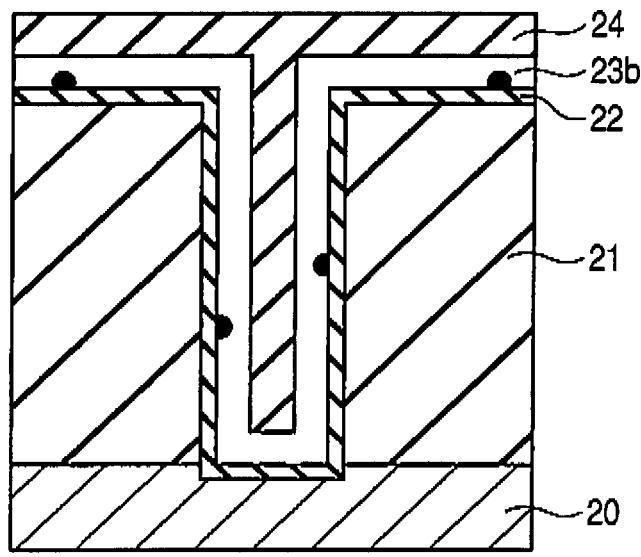
F I G. 11
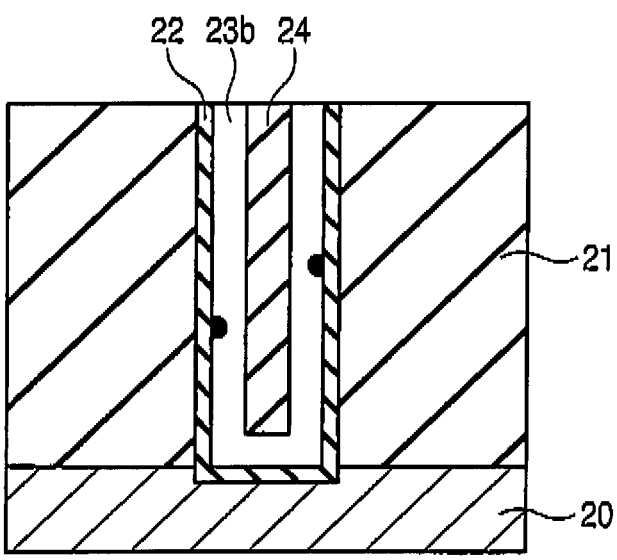
F I G. 12

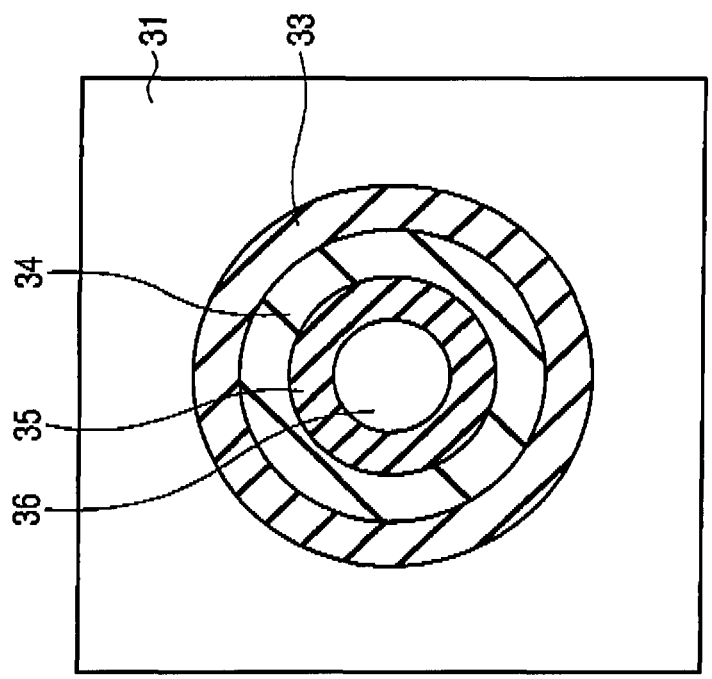
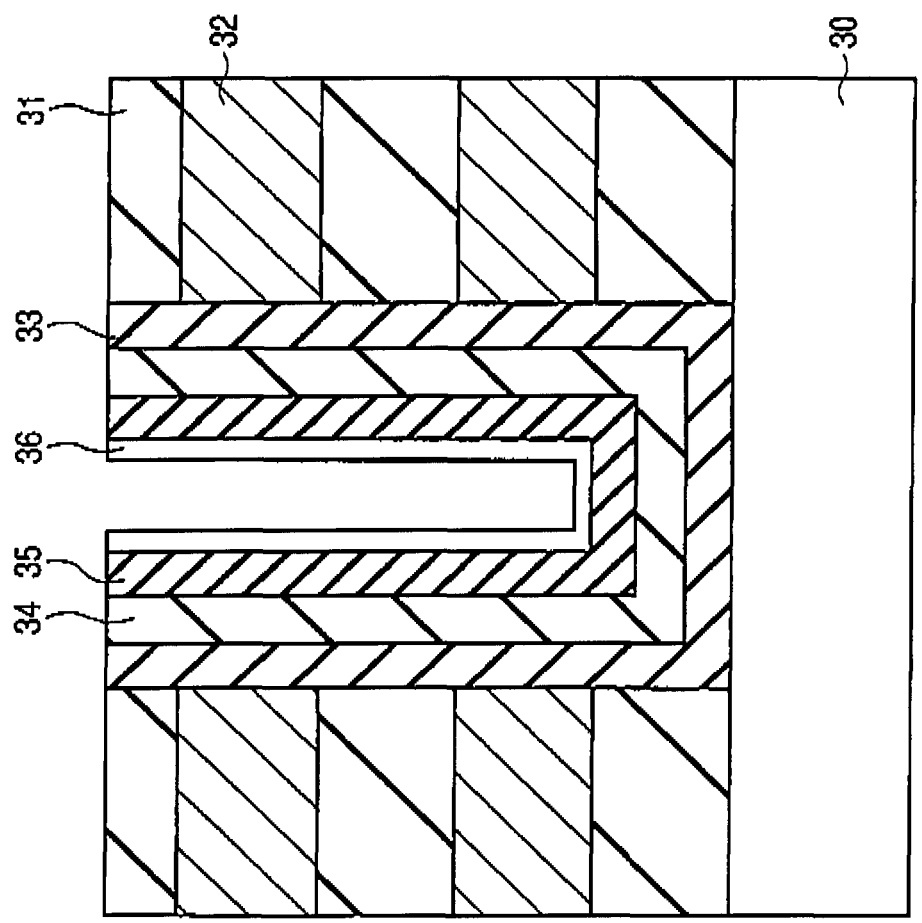
FIG. 15A
FIG. 15B

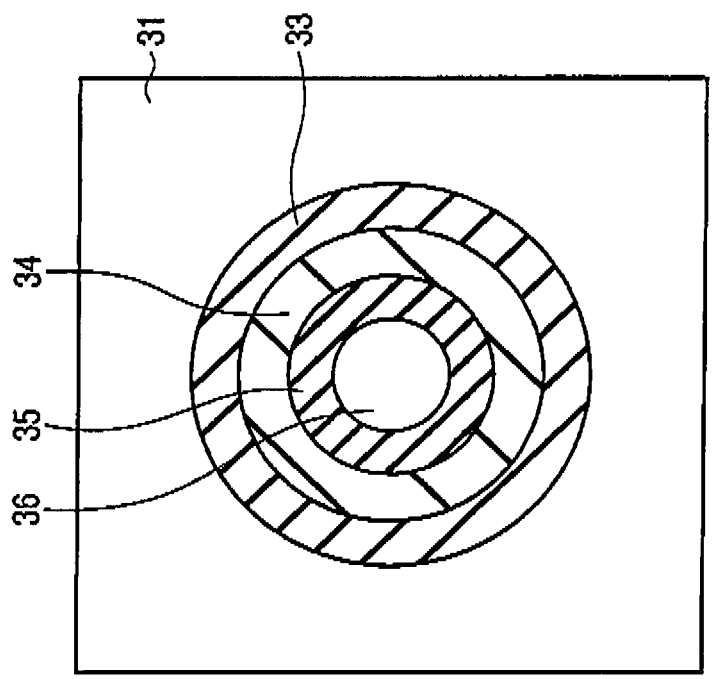
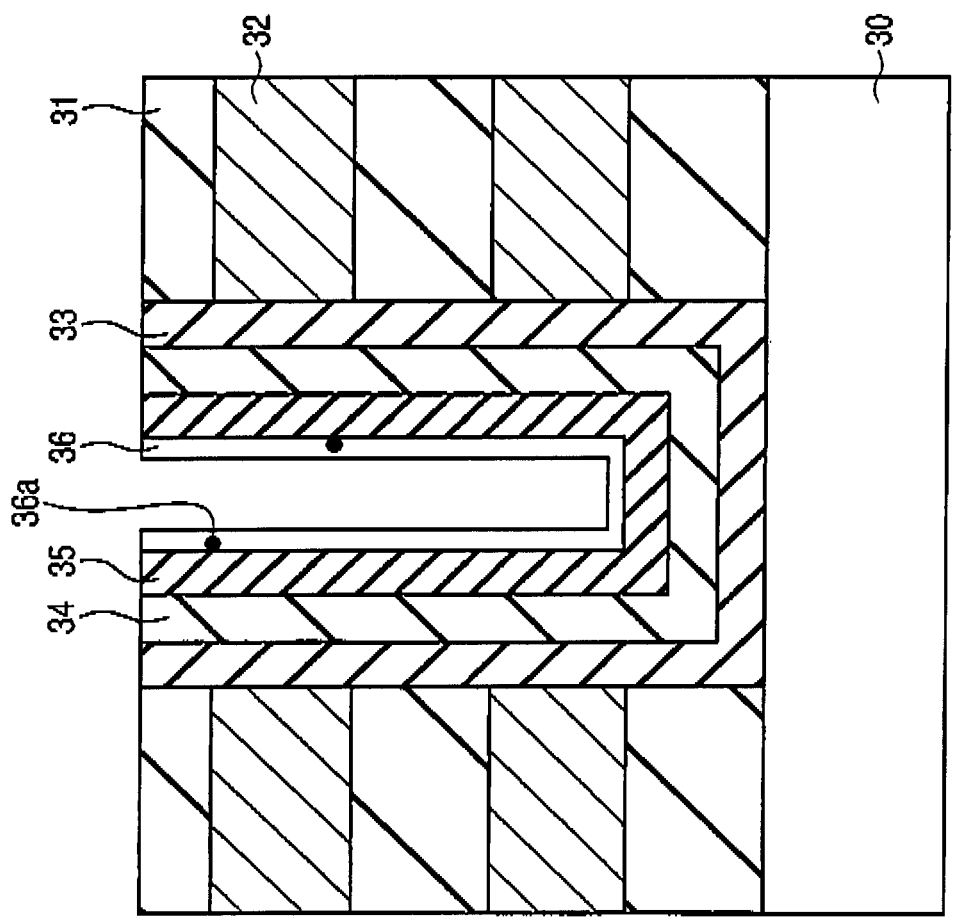
FIG. 16B
FIG. 16A

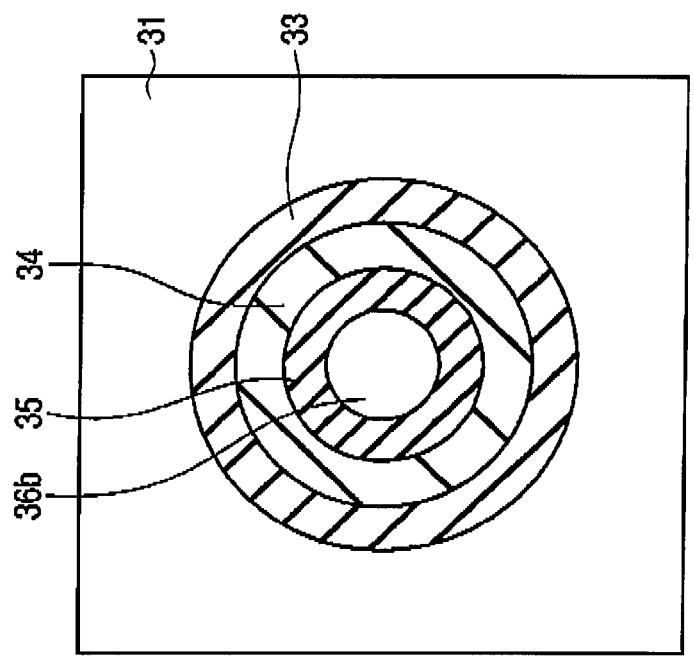
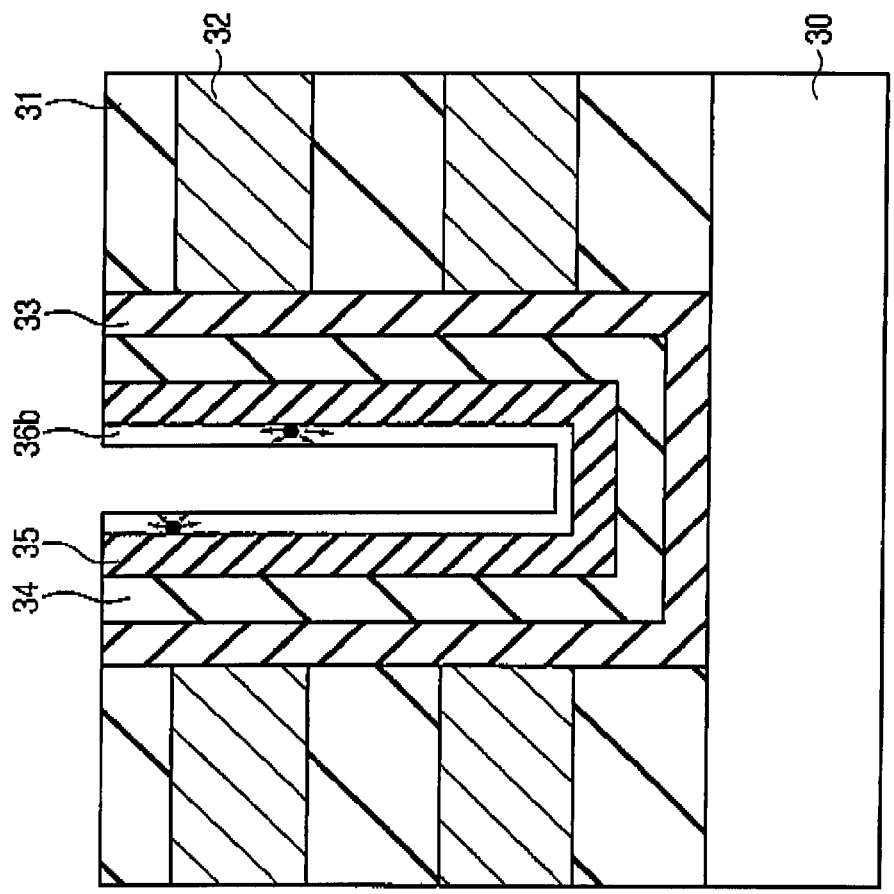
FIG. 17A
FIG. 17B

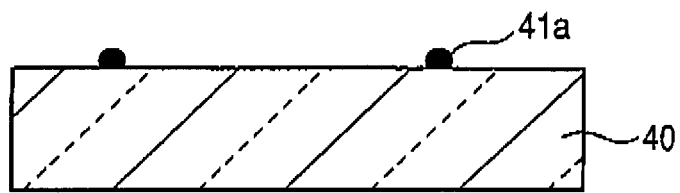
F I G. 18
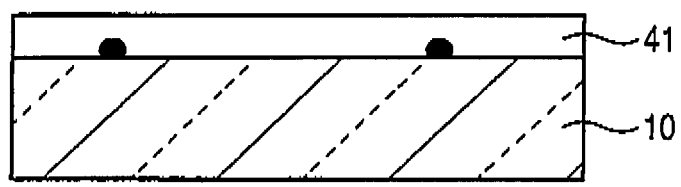
F I G. 19
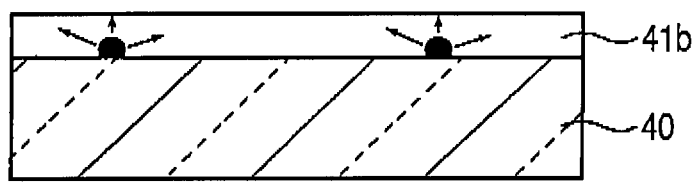
F I G. 20
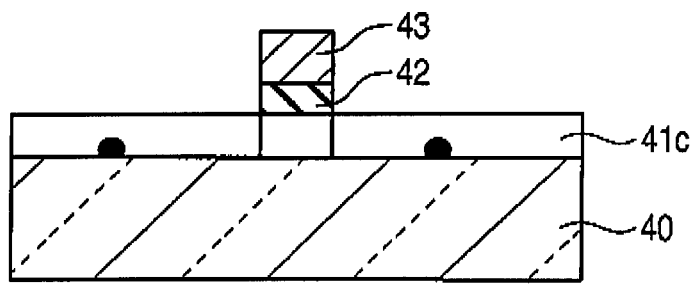
F I G. 21

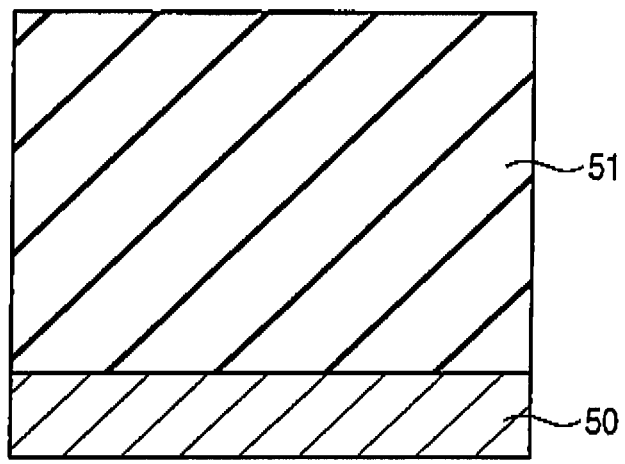
F I G. 22
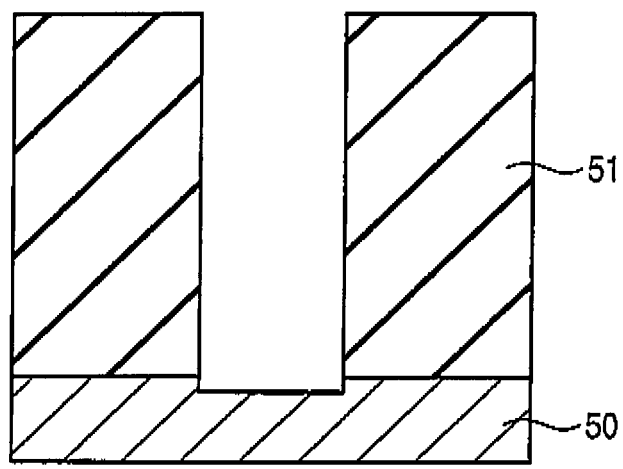
F I G. 23

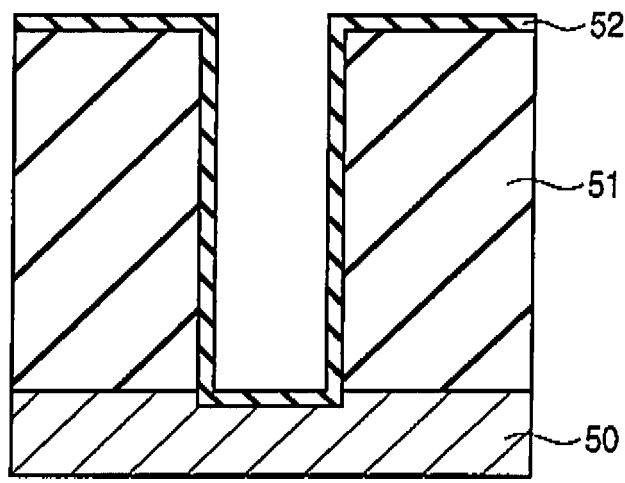
F I G. 24
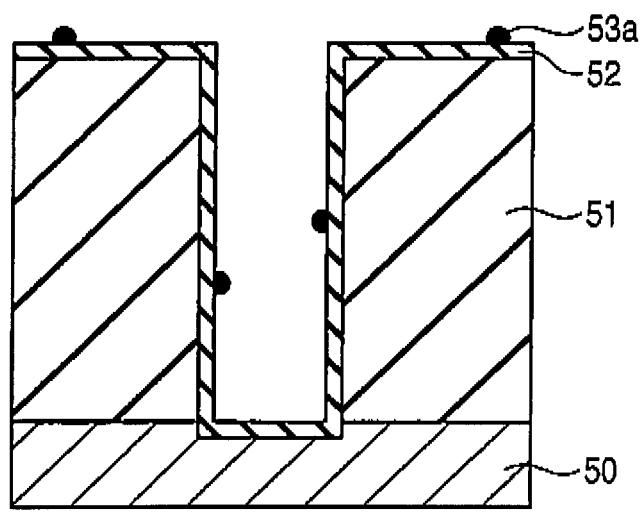
F I G. 25

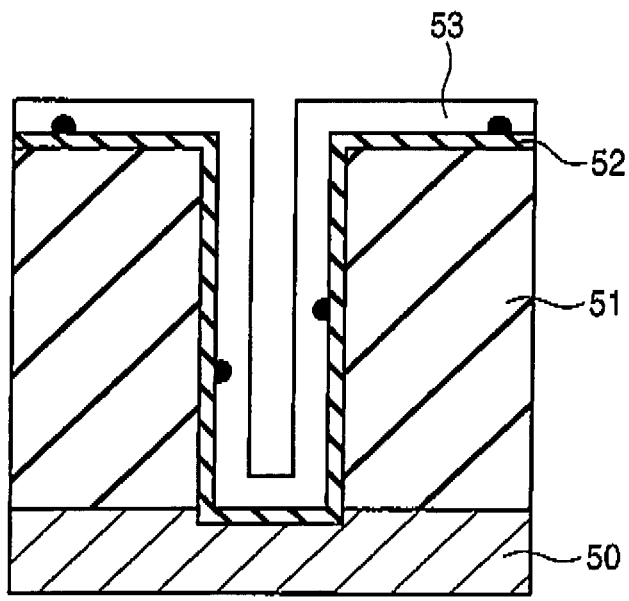
F I G. 26
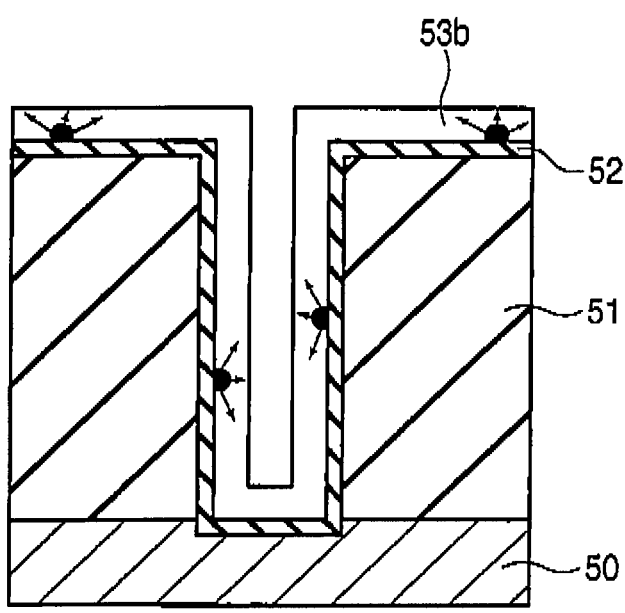
F I G. 27

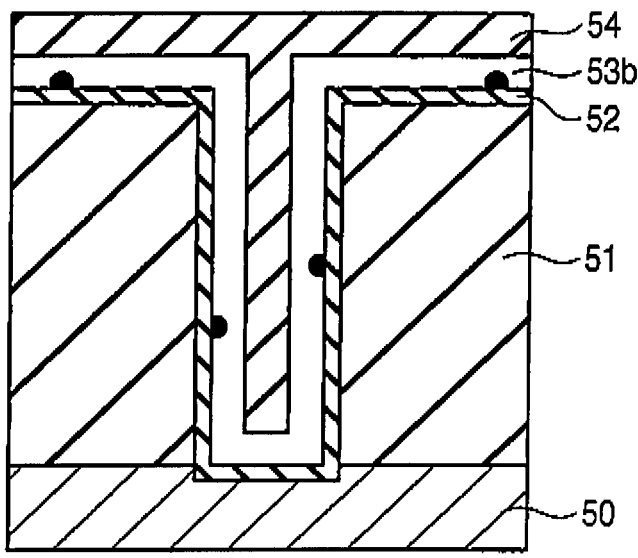
F I G. 28
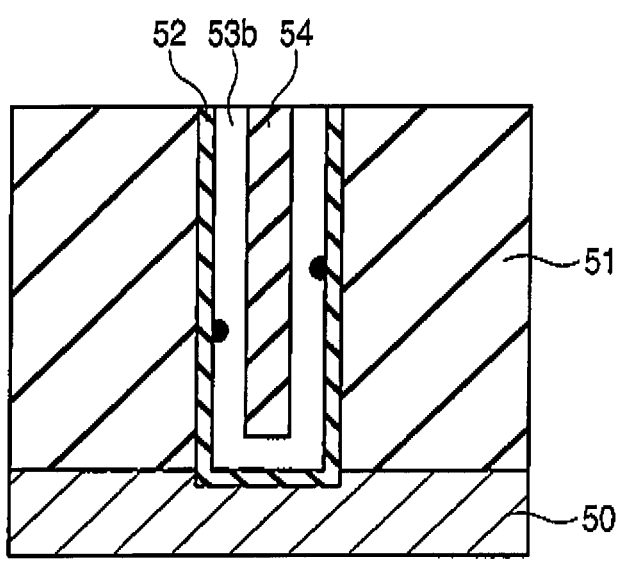
F I G. 29

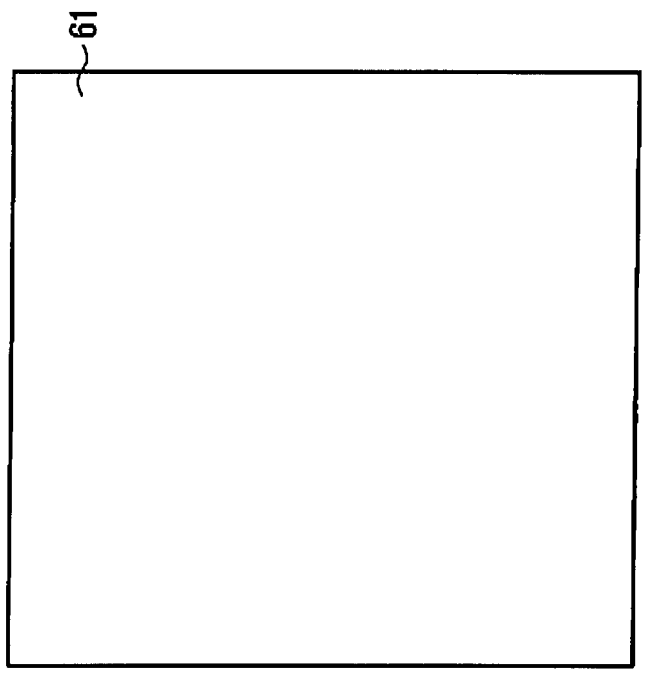
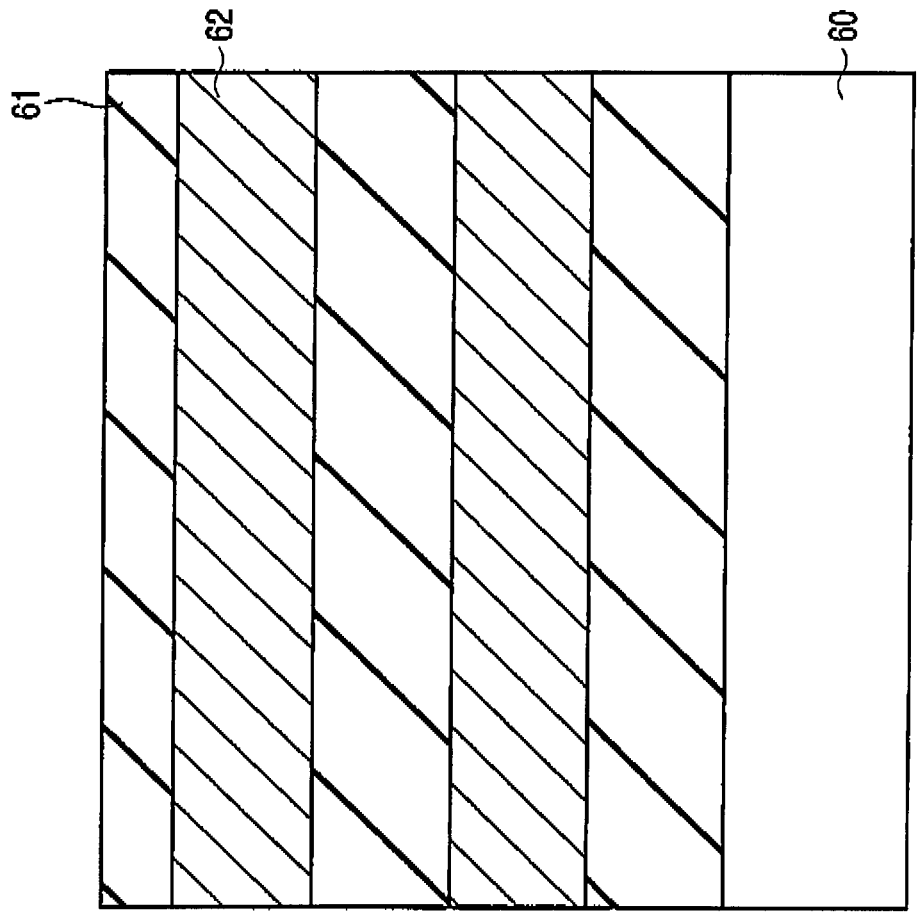
F I G. 30B
F I G. 30A

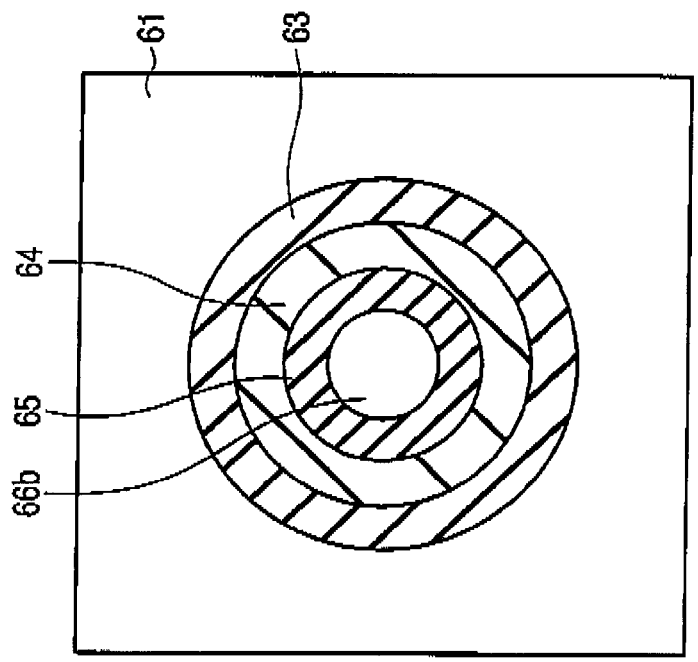
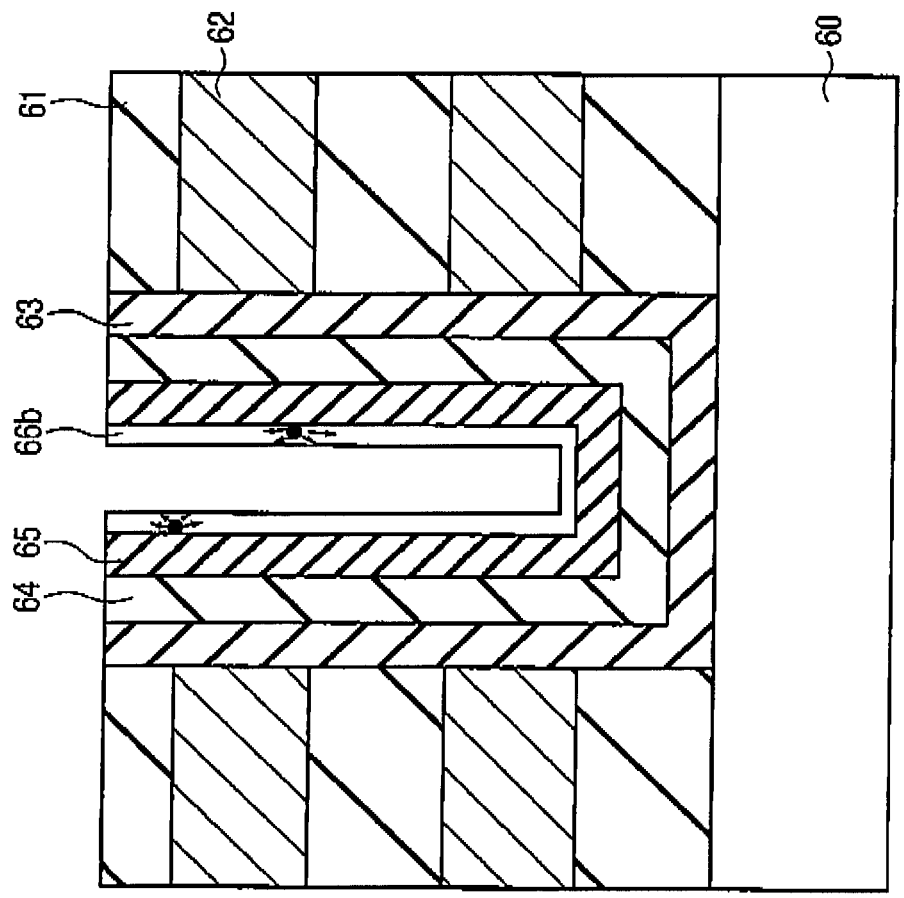
FIG. 34B
FIG. 34A

SEMICONDUCTOR DEVICE AND METHOD FOR MANUFACTURING SEMICONDUCTOR DEVICE

CROSS-REFERENCE TO RELATED APPLICATIONS

This application is based upon and claims the benefit of priority from Japanese Patent Application No. 2010-047014, filed Mar. 3, 2010; the entire contents of which are incorporated herein by reference.

FIELD

Embodiments described herein relate generally to a semiconductor device and a method for manufacturing a semiconductor device.

BACKGROUND

In recent years, polycrystalline silicon, which has high mobility, has been expected to be used as channel silicon in a semiconductor memory (three-dimensional memory) device in which thin film transistors (TFT) and memory cells are three-dimensionally arranged.

To allow such a polycrystalline silicon film to be formed so as to have a smooth morphology and to appropriately cover steps, first, amorphous silicon is deposited at a low temperature of between 450° C. and 550° C. The amorphous silicon offers high resistance and thus needs to be made polycrystalline to offer reduced resistance. Thus, the amorphous silicon is thermally treated at a high temperature of at least 900° C. so as to be crystallized. However, when the amorphous silicon is thermally treated at such a high temperature, nuclei are formed in the amorphous silicon. The amorphous silicon thus has a small grain size and different crystal shapes. As a result, the number of interfaces (grain boundaries) between crystals increases and the polycrystalline silicon film has a roughened morphology. This disadvantageously prevents the resistance from being sufficiently reduced.

Furthermore, disadvantageously, the thermal treatment at high temperatures may, for example, reduce a gate dielectric strength voltage or increase a junction leakage current in peripheral transistors.

As a method for crystallizing the amorphous silicon to increase the grain size, a method has been proposed in which an amorphous Si film is crystallized by growing the amorphous silicon in a solid phase using crystals Ge contacted with the amorphous silicon, as nuclei (see, for example, V. Subramanian et al., "High-performance Germanium-seeded Laterally Crystallized TFT's For Vertical Device Integration" IEEE Transactions On Electron Devices, Vol. 45, No. 9, September 1998, pp. 1934-1939). In this case, $SiO_2$ is formed on amorphous silicon with a thickness of 100 nm, and a 1 μm hole is formed in the amorphous silicon. Then, Ge is formed in the hole between 450° C. and 500° C. so that the amorphous silicon is crystallized using Ge as nuclei. A crystallization temperature for the silicon is between 500° C. and 550° C. Thereafter, Ge is etched away with $H_2SO_4/H_2O_2$. Furthermore, $SiO_2$ is etched away with HF to obtain a polycrystalline Si layer. However, this step is complicated. The crystallization of amorphous silicon requires several hours at 600° C. Thus, if the temperature is set to a smaller value of between 500° C. and 550° C., the crystallization is expected to require several tens of hours, though this may depend on the interval of the Ge nuclei. Hence, throughput is low, disadvantageously leading to an increase in manufacturing costs.

Furthermore, a method has been proposed which comprises forming island-shaped Ge (see K. Yasutake et al., "Size and Density Control of Crystalline Ge Islands on Glass Substrates by oxygen Etching" Japan Journal of Applied Physics, Vol. 43, No. 12A, 2004, pp. L1552-L1554), then depositing amorphous silicon, and thereafter crystallizing the amorphous silicon by thermal treatment to obtain silicon with a large grain size (see C. Yoshimoto et al., "Formation of Polycrystalline Si Thin Films Using Nanocrystalline Ge Nuclei", IEICE Technical Report SDM2008, April 2008, pp. 89-93). To form island-shaped Ge, first, Ge nuclei with an average grain size of 89 nm and a density of about $10^8/cm^2$ are formed by depositing an amorphous Ge film to a thickness of 50 nm and carrying out vacuum annealing at 500° C. for 2 hours and oxygen etching at 400° C. for 3 hours. Thereafter, an amorphous silicon film is deposited by electron beam evaporation or plasma CVD and then thermally treated between 480° C. and 620° C. Thus, the amorphous silicon film changes to a polycrystalline silicon film with silicon with a large grain size. However, also in this case, the crystallization of the amorphous silicon requires a long time: about 2 hours at 580° C., about 12 hours at 540° C., and at least 20 hours at 500° C. or 480° C. At the low temperatures, the throughput is low, disadvantageously increasing manufacturing costs. Furthermore, since the crystal Ge nucleus has a grain size of several tens of nm, the amorphous silicon has a film thickness of at least 100 nm.

In general, the crystallization temperature tends to increase with decreasing film thickness. Thus, crystallization of amorphous silicon with a film thickness of at most 10 nm is expected to require a further longer crystallization time than crystallization of amorphous silicon with a film thickness of 100 nm. A further lower throughput results from crystallization of a thin amorphous silicon film with a film thickness of at most 10 nm, disadvantageously leading to an increase in manufacturing costs.

Thus, the conventional art has difficulty crystallizing amorphous silicon at low temperatures in a short time.

BRIEF DESCRIPTION OF THE DRAWINGS

FIG. 11 is a sectional view schematically showing a part of the basic method for manufacturing a semiconductor device according to Modification 1 of the first embodiment;

FIG. 12 is a sectional view schematically showing a part of the basic method for manufacturing a semiconductor device according to Modification 1 of the first embodiment;

FIG. 15A is a sectional view schematically showing a part of the basic method for manufacturing a semiconductor device according to Modification 2 of the first embodiment, and FIG. 15B is a sectional view schematically showing a part of the basic method for manufacturing a semiconductor device according to Modification 2 of the first embodiment;

FIG. 16A is a sectional view schematically showing a part of the basic method for manufacturing a semiconductor device according to Modification 2 of the first embodiment, and FIG. 16B is a sectional view schematically showing a part of the basic method for manufacturing a semiconductor device according to Modification 2 of the first embodiment;

FIG. 17A is a sectional view schematically showing a part of a basic method for manufacturing a semiconductor device according to Modification 2 of the first embodiment, and FIG. 17B is a sectional view schematically showing a part of the basic method for manufacturing a semiconductor device according to Modification 2 of the first embodiment;

FIG. 18 is a sectional view schematically showing a part of a basic method for forming polycrystalline channel Si in a thin film transistor according to a second embodiment;

FIG. 19 is a sectional view schematically showing a part of the basic method for forming polycrystalline channel Si in a thin film transistor according to the second embodiment;

FIG. 20 is a sectional view schematically showing a part of the basic method for forming polycrystalline channel Si in a thin film transistor according to the second embodiment;

FIG. 21 is a sectional view schematically showing a part of the basic method for forming polycrystalline channel Si in a thin film transistor according to the second embodiment;

FIG. 22 is a sectional view schematically showing a part of a basic method for manufacturing a semiconductor device according to Modification 1 of the second embodiment;

FIG. 23 is a sectional view schematically showing a part of the basic method for manufacturing a semiconductor device according to Modification 1 of the second embodiment;

FIG. 24 is a sectional view schematically showing a part of the basic method for manufacturing a semiconductor device according to Modification 1 of the second embodiment;

FIG. 25 is a sectional view schematically showing a part of the basic method for manufacturing a semiconductor device according to Modification 1 of the second embodiment;

FIG. 26 is a sectional view schematically showing a part of the basic method for manufacturing a semiconductor device according to Modification 1 of the second embodiment;

FIG. 27 is a sectional view schematically showing a part of the basic method for manufacturing a semiconductor device according to Modification 1 of the second embodiment;

FIG. 28 is a sectional view schematically showing a part of the basic method for manufacturing a semiconductor device according to Modification 1 of the second embodiment;

FIG. 29 is a sectional view schematically showing a part of the basic method for manufacturing a semiconductor device according to Modification 1 of the second embodiment;

FIG. 30A is a sectional view schematically showing a part of a basic method for manufacturing a semiconductor device according to Modification 2 of the second embodiment, and FIG. 30B is a sectional view schematically showing a part of the basic method for manufacturing a semiconductor device according to Modification 2 of the second embodiment;

FIG. 34A is a sectional view schematically showing a part of the basic method for manufacturing a semiconductor device according to Modification 2 of the second embodiment, and FIG. 34B is a sectional view schematically showing a part of the basic method for manufacturing a semiconductor device according to Modification 2 of the second embodiment.

DETAILED DESCRIPTION

In general, according to one embodiment, a method for manufacturing a semiconductor device, wherein an amorphous semiconductor film comprising a microcrystal is annealed using a microwave, to crystallize the amorphous semiconductor film comprising the microcrystal using the microcrystal as a nucleus.

Embodiments will be described below with reference to the drawings.

First Embodiment

With reference to FIG. 1 to FIG. 4, a method for manufacturing a semiconductor device according to a first embodiment will be described in brief. FIG. 1 to FIG. 4 are sectional views schematically showing a method for forming polycrystalline channel Si in a thin film transistor (TFT).

Figure 1:
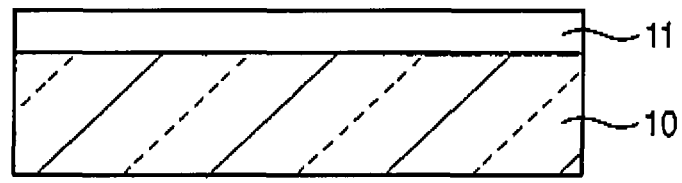
FIG. 1 is a sectional view schematically showing a part of a basic method for forming polycrystalline channel Si in a thin film transistor according to a first embodiment.

First, as shown in FIG. 1, an amorphous silicon film 11 that is an amorphous semiconductor film with a thickness of between about 50 nm and about 100 nm is deposited all over a surface of an insulating foundation, specifically a substrate (glass substrate) 10 using $SiH_4$ or $Si_2H_6$ or both of these gases. At this time, Ge may be fed into the amorphous silicon film 11 using $GeH_4$ diluted with $N_2$, Ar, or the like. The concentration of Ge is, for example, between about 5% and about 20%. In this case, P, As, In, or the like may be fed.

Figure 2:
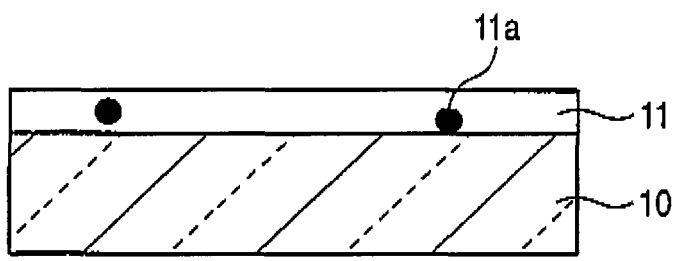
FIG. 2 is a sectional view schematically showing a part of the basic method for forming polycrystalline channel Si in a thin film transistor according to the first embodiment.

Then, as shown in FIG. 2, a short-time and high-temperature thermal treatment is carried out, such as milli second annealing (MSA) at a temperature of about 700° C. and about 1,000° C. and a treatment time of between about 0.1 ms and about 0.3 s or rapid thermal annealing (RTA) at a treatment time of between about 0.3 s and about 2 s. Thus, microcrystals 11a are formed in the amorphous silicon film 11 at a low frequency. At this time, it is possible to use, for example, a heating method based on laser scan such as laser spike annealing (LSA), as MSA, instead of carrying out the thermal treatment all over the surface of the amorphous silicon film 11. Thus, the amorphous silicon film 11 may be partly microcrystallized or crystallized. Furthermore, if Ge is fed into the amorphous silicon film 11, a microcrystal generation temperature decreases, enabling microcrystals to be formed by annealing at lower temperatures. The microcrystals formed in the amorphous silicon film 11 are microcrystal silicon. However, if the amorphous silicon film 11 comprises Ge, microcrystals Ge and microcrystals SiGe are also formed.

Figure 3:
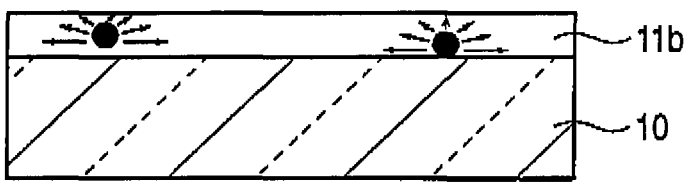
FIG. 3 is a sectional view schematically showing a part of the basic method for forming polycrystalline channel Si in a thin film transistor according to the first embodiment.

Then, as shown in FIG. 3, the amorphous silicon film 11 comprising the crystals 11a is irradiated with microwaves to increase the temperature of the substrate to about 200° C. to about 600° C. (preferably about 200° C. to about 400° C.). Thus, the microwaves are used to carry out annealing for between about 5 minutes and about 2 hours. The microwave annealing allows the amorphous silicon film 11 to be crystallized using the microcrystals 11a as nuclei. Thus, a polycrystalline channel silicon film (polycrystalline silicon film) 11b is formed which is an aggregate of crystals with a grain size of between 50 nm and about 100 μm.

The frequency of the microwaves is desirably 2.45 GHz, 5.80 GHz, or 24.125 GHz, which is specified as a band. This is because of the availability of a magnetron or the like which generates microwaves, which is inexpensive. Furthermore, the microwaves used have a given frequency width, and 2.45 GHz, 5.80 GHz, and 24.125 GHz, described above, are each included in the frequency width of the microwaves used.

Figure 4:
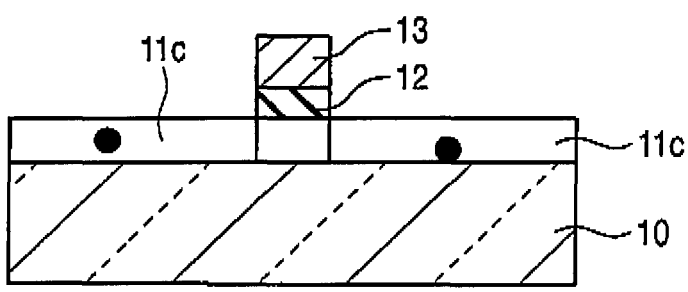
FIG. 4 is a sectional view schematically showing a part of the basic method fox forming polycrystalline channel Si in a thin film transistor according to the first embodiment.

Then, as shown in FIG. 4, a TFT according to the first embodiment can be formed through well-known steps, that is, the steps of forming a gate insulating film 12, a gate electrode 13, a source drain diffusion layer 11c, and the like.

According to the above-described first embodiment, the short-time and high-temperature annealing such as MSA or spike RTA is carried out on the amorphous silicon film 11 to form microcrystals 11a in the amorphous silicon film 11 at a low frequency. Thereafter, the amorphous silicon film 11 comprising the microcrystals 11a is annealed at a low temperature of between 200° C. and 600° C. using microwaves. Thus, the amorphous silicon film 11 is crystallized using the microcrystals 11a as nuclei. Crystallized silicon has a grain size of between about 50 nm and about 10 μm. Hence, the microcrystals have a density of between $10^6$/cm$^2$ and $10^{11}$/cm$^2$.

Basically, the amorphous silicon is not crystallized at 600° C. or lower. However, if the amorphous silicon comprises microcrystals, irradiating the microcrystals with microwaves allows the amorphous silicon to be crystallized using the microcrystals as nuclei.

When annealing is carried out at the low temperature using microwaves, the formation of nuclei in the amorphous silicon can be suppressed to allow appropriately shaped crystals to be formed. Thus, appropriate interfaces (grain boundaries) are formed between the crystals to reduce the electric resistance in the polycrystalline silicon. This increases the mobility in the polycrystalline silicon. Furthermore, the low-temperature annealing also allows a possible decrease in withstand voltage in peripheral transistors to be suppressed. Moreover, since the microcrystals 11a are formed at a low frequency, the crystals in the polycrystalline channel silicon film 11b have an increased grain size. This enables a reduction in the number of grain boundaries in the polycrystalline channel silicon film 11b and thus in the electric resistance of the polycrystalline channel silicon film 11b. Furthermore, the use of the microwave annealing allows the amorphous silicon film 11 to be crystallized in a short time.

Thus, the amorphous silicon film 11 can be crystallized at low temperatures in a short time. Therefore, a semiconductor device comprising a high-quality polycrystalline silicon film with an appropriate shape and reduced resistance can be formed at a high throughput.

Furthermore, if the amorphous silicon film 11 is crystallized using microcrystals Ge or SiGe as nuclei, the crystals are grown faster than in conventional lamp annealing or furnace annealing. Therefore, the throughput is further increased, and a low-cost semiconductor device can be provided.

(Modification 1)

In the above-described first embodiment, microcrystals are formed in the amorphous silicon film, and irradiated with microwaves to form a polycrystalline silicon film in the planar structure. In Modification 1 of the first embodiment, a method will be described in which high-quality polycrystal is formed in a hole structure using the method for forming a polycrystalline silicon film according to the first embodiment.

A method for manufacturing a semiconductor device according to Modification 1 of the first embodiment will be described in brief with reference to FIG. 5 to FIG. 12. FIG. 5 to FIG. 12 are sectional views schematically showing the method for manufacturing a semiconductor device according to Modification 1 of the first embodiment.

Figure 5:
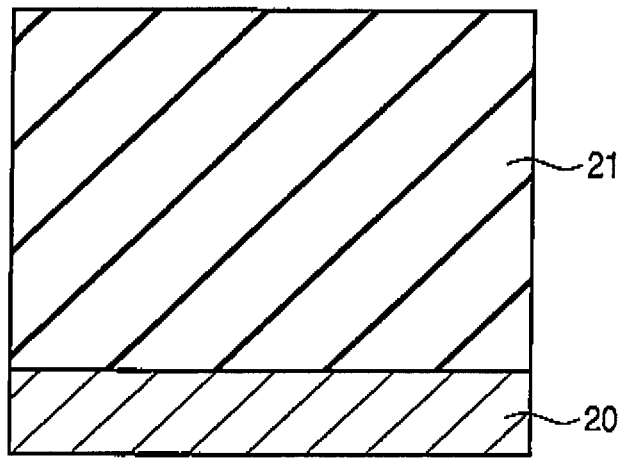
FIG. 5 is a sectional view schematically showing a part of a basic method for manufacturing a semiconductor device according to Modification 1 of the first embodiment.

First, as shown in FIG. 5, an SiN stopper film (not shown in the drawings) is formed on an electrode 20 formed of polycrystalline silicon or metal or metal silicide on a silicon substrate (not shown in the drawings). $SiO_2$ and Si are stacked on the SiN stopper film a number of times to form a stack structure 21.

Figure 6:
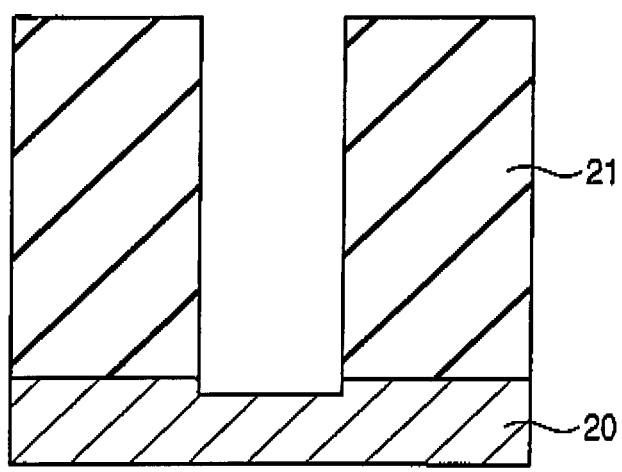
FIG. 6 is a sectional view schematically showing a part of the basic method for manufacturing a semiconductor device according to Modification 1 of the first embodiment.

Then, as shown in FIG. 6, for example, a hole (opening) is formed in the stack structure 21 using, for example, reactive ion etching (RIE), to expose a surface of the electrode 20.

Figure 7:
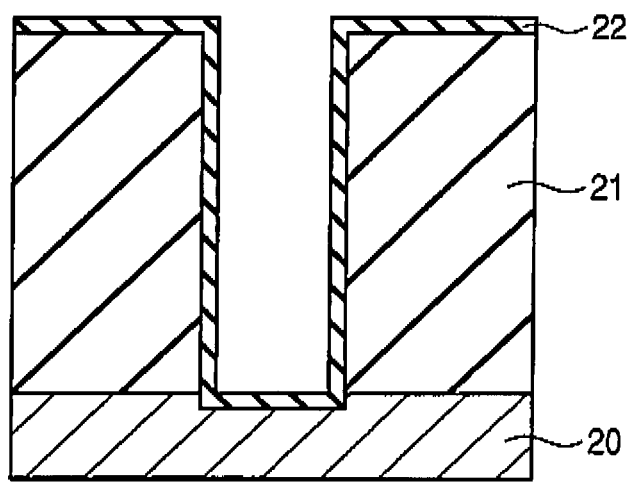
FIG. 7 is a sectional view schematically showing a part of the basic method for manufacturing a semiconductor device according to Modification 1 of the first embodiment.

Then, as shown in FIG. 7, an $SiO_2$ film is deposited in the hole, and an SiN film is deposited on the $SiO_2$ film. A surface of the SiN film is oxidized to form an insulating film 22 of an ONO structure in which an oxide film, a nitride film, and an oxide film are stacked.

Figure 8:
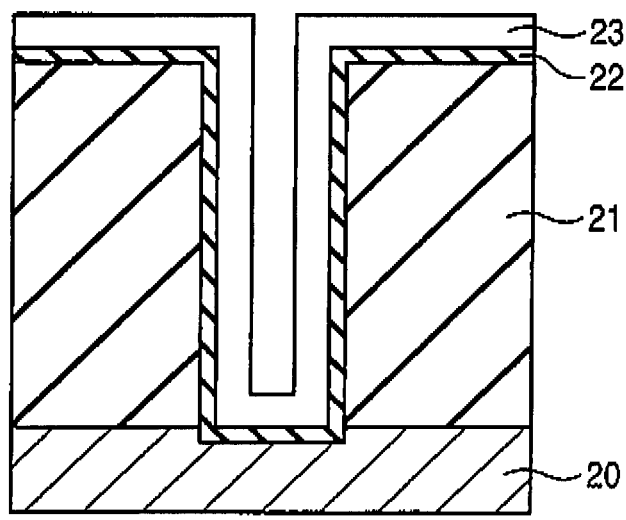
FIG. 8 is a sectional view schematically showing a part of the basic method for manufacturing a semiconductor device according to Modification 1 of the first embodiment.

Then, as shown in FIG. 8, an amorphous silicon film 23 with a thickness of between 5 nm and 20 nm is deposited on the insulating film 22 at a low temperature of about 500° C., using $SiH_4$ or $Si_2H_6$ or both of these gases.

Figure 9:
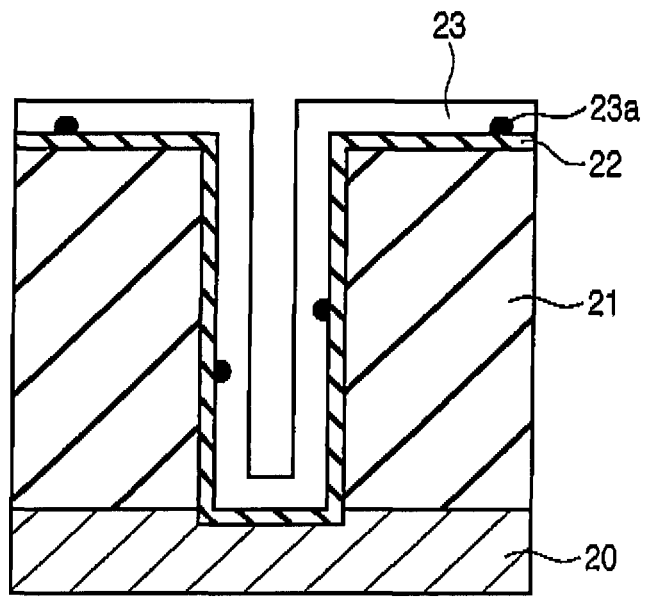
FIG. 9 is a sectional view schematically showing a part of the basic method for manufacturing a semiconductor device according to Modification 1 of the first embodiment.

Then, as shown in FIG. 9, a short-time and high-temperature thermal treatment such as MSA with a duration of between about 0.1 ms and about 2 s or RTA is carried out between about 700° C. and about 1,000° C. Thus, microcrystals 23 are formed in the amorphous silicon film 23 at a low frequency. At this time, like the first embodiment, the present embodiment may use, for example, a heating method such as LSA instead of carrying out the thermal treatment all over the surface of the amorphous silicon film 23. Hence, a partial area of the amorphous silicon film may be microcrystallized or crystallized. Furthermore, if Ge is fed into the amorphous silicon film 23, the microcrystal generation temperature decreases, enabling microcrystals to be formed by annealing at lower temperatures. The microcrystals formed in the amorphous silicon film 23 are microcrystal silicon. However, if the amorphous silicon film 23 comprises Ge, microcrystals Ge and microcrystals SiGe are also formed.

Figure 10:
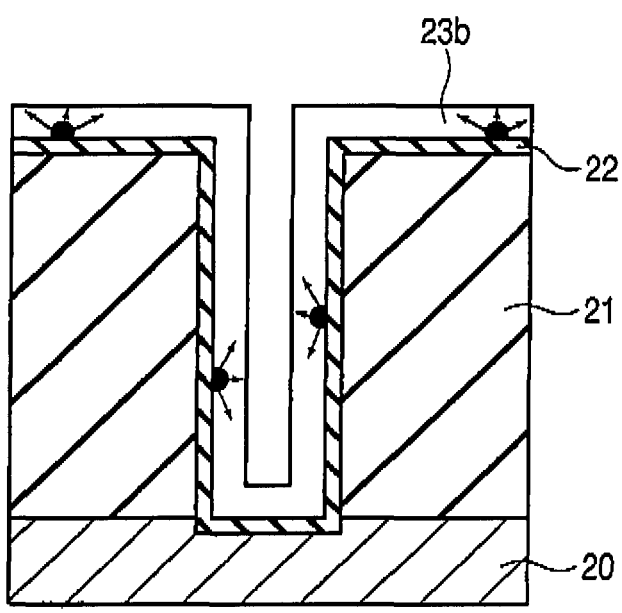
FIG. 10 is a sectional view schematically showing a part of the basic method for manufacturing a semiconductor device according to Modification 1 of the first embodiment.

Then, as shown in FIG. 10, the amorphous silicon film 23 comprising the crystals 23a is irradiated with microwaves to increase the temperature of the substrate to about 200° C. to about 600° C. (preferably about 200° C. to about 400° C.). Thus, the microwaves are used to carry out annealing for between about 5 minutes and about 2 hours. The microwave annealing allows the amorphous silicon film 23 to be crystallized using the microcrystals 23a as nuclei. Thus, a polycrystalline channel silicon film (polycrystalline silicon film) 23b is formed which is an aggregate of crystals with a grain size of between 50 nm and about 100 μm.

Then, as shown in FIG. 11, an SiN film 24 is deposited all over the resulting surface so as to be buried in the hole structure formed by the polycrystalline channel silicon film 23b.

Then, as shown in FIG. 12, extra portions of the SiN film 24, the polycrystalline channel silicon film 23b, and the insulating film 22 are removed by RIE or the like until the top surface of the stack structure 21 is exposed. In this manner, the high-quality polycrystalline channel silicon film 23b is formed in the hole in the stack structure 21.

According to the above-described Modification 1 of the first embodiment, the short-time and high-temperature annealing is carried out on the amorphous silicon film 23 to form microcrystals 23a in the amorphous silicon film 23 at a low frequency as is the case with the first embodiment. Thereafter, the amorphous silicon film 23 comprising the microcrystals 23a is annealed at a low temperature of between 200° C. and 600° C. using microwaves. Thus, the amorphous silicon film 23 is crystallized using the microcrystals 23a as nuclei.

Accordingly, the amorphous silicon film 23 can be crystallized at low temperatures in a short time. Furthermore, a high-quality polycrystalline silicon film with an appropriate shape and a reduced resistance can be formed in the hole in the stack structure 21 at a high throughput.

Additionally, if the amorphous silicon film 23 is crystallized using microcrystals Ge or SiGe as nuclei, the crystals are grown faster than in conventional lamp annealing or furnace annealing. Therefore, the throughput is further increased, and a low-cost semiconductor device can be provided.

(Modification 2)

In Modification 2 of the first embodiment, a method will be described in which a polycrystalline channel silicon film is formed in a nonvolatile semiconductor memory device with a three-dimensional structure that uses a three-dimensional stacking technique called bit cost scalable (BiCS).

With reference to FIGS. 13A and 13B to FIGS. 17A and 17B, a basic method for manufacturing a semiconductor device according to Modification 2 of the first embodiment will be described in brief.

FIGS. 13A to 17A are sectional views taken along a channel length direction and schematically showing the method for manufacturing a semiconductor device according to Modification 2 of the first embodiment. FIGS. 13B to 17B are plan views taken along a direction perpendicular to the channel length direction and schematically showing a part of the method for manufacturing a semiconductor device according to Modification 2 of the first embodiment.

Figure 13B:
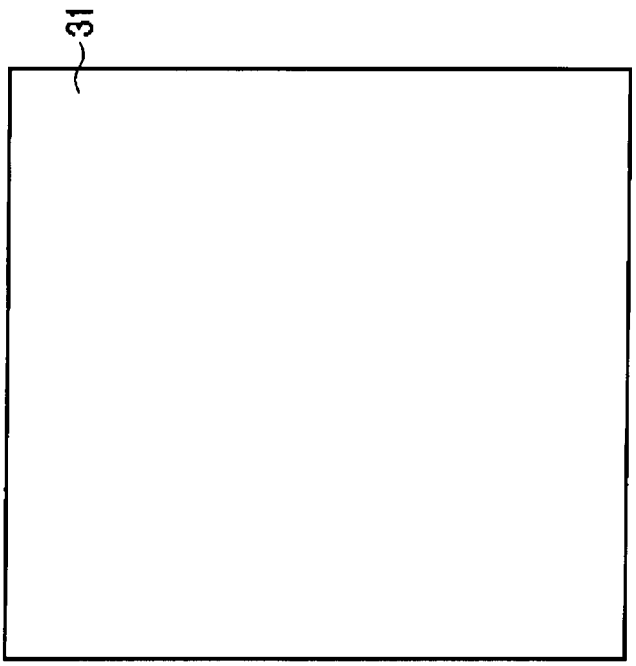
FIG. 13B is a sectional view schematically showing a part of the basic method for manufacturing a semiconductor device according to Modification 2 of the first embodiment.
Figure 13A:
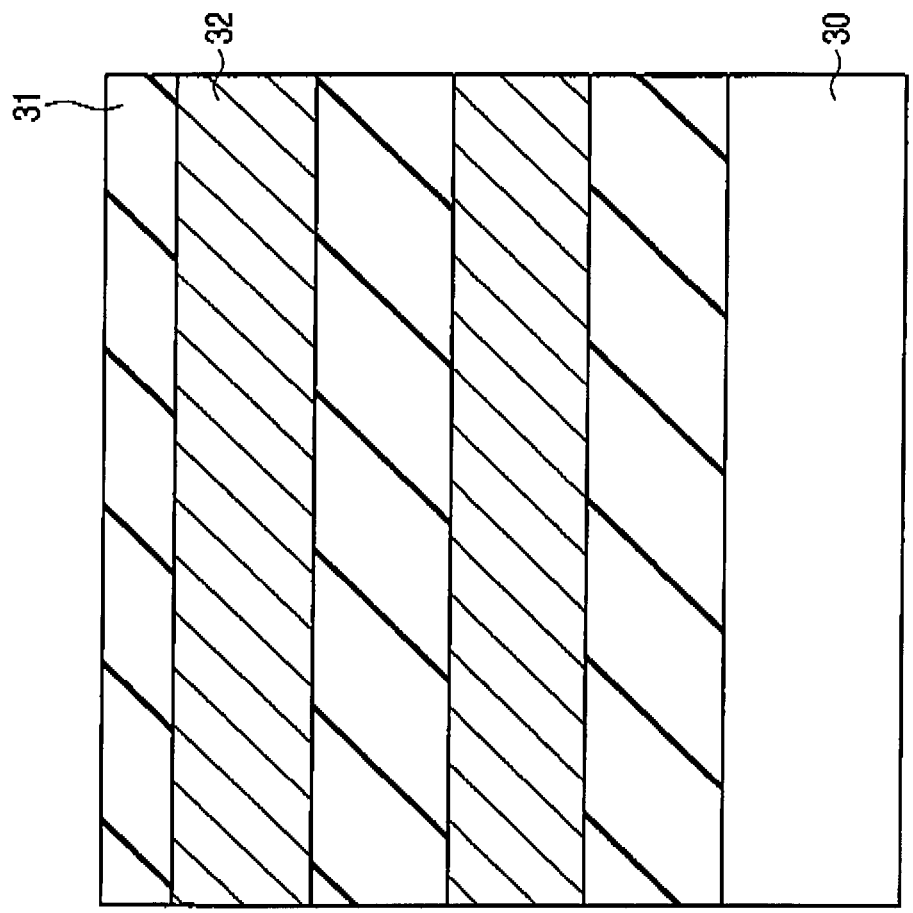
FIG. 13A is a sectional view schematically showing a part of a basic method for manufacturing a semiconductor device according to Modification 2 of the first embodiment.

First, as shown in FIGS. 13A and 13B, a silicon oxide film with a thickness of about 50 nm and a silicon film with a thickness of about 50 nm are alternately deposited on a surface of a semiconductor substrate 30 a desired number of times using a CVD method; the silicon oxide film serves as an interlayer insulating film 31, and the silicon film comprises impurities doped therein and serves as a control gate electrode 32. For example, a metal material such as tantalum nitride may be used as the control gate electrode 32.

Figure 14B:
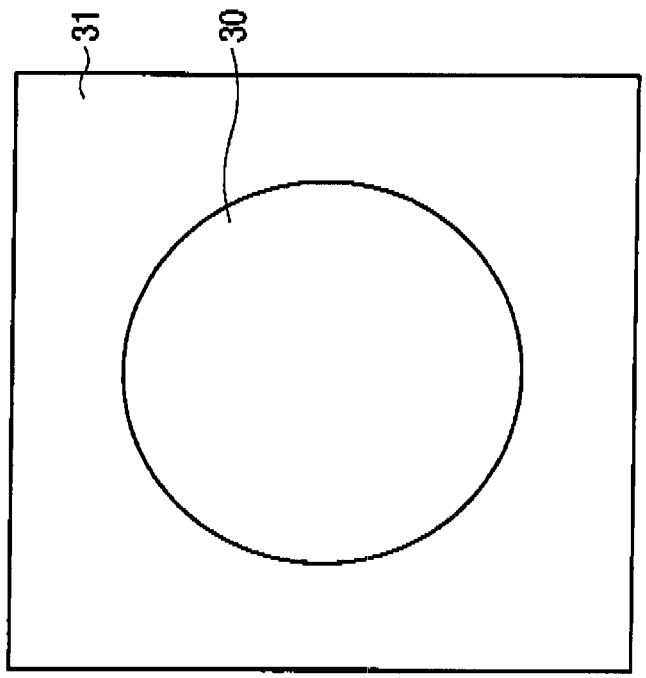
FIG. 14B is a sectional view schematically showing a part of the basic method for manufacturing a semiconductor device according to Modification 2 of the first embodiment.
Figure 14A:
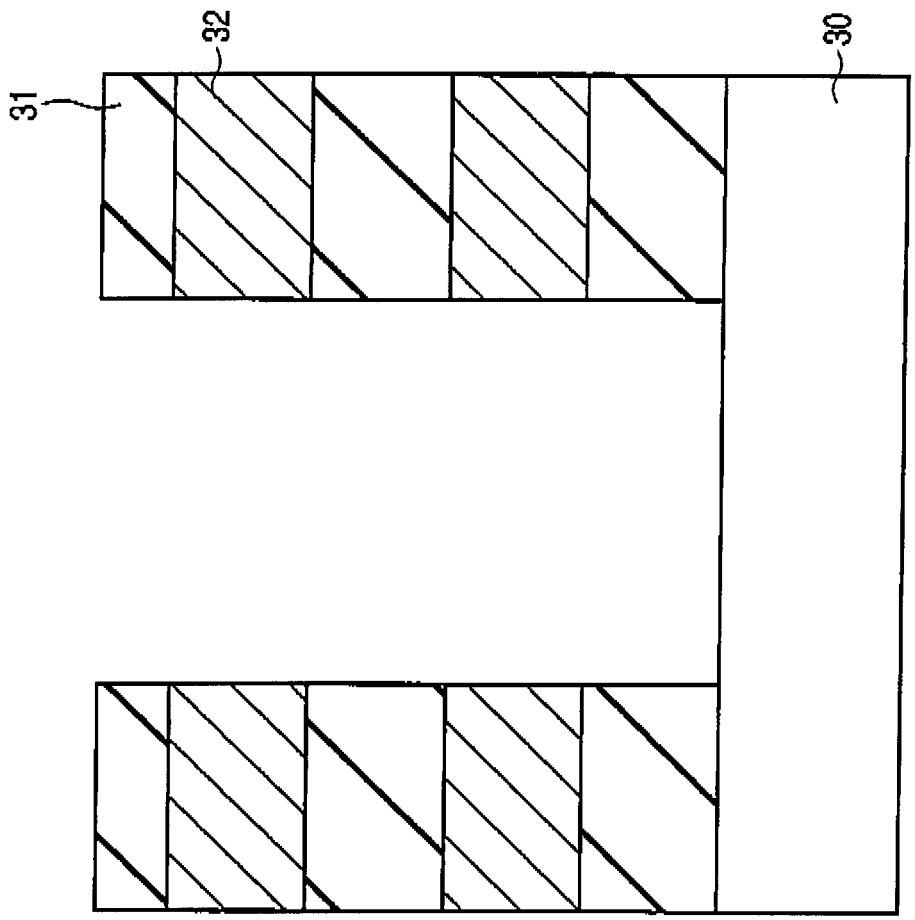
FIG. 14A is a sectional view schematically showing a part of the basic method for manufacturing a semiconductor device according to Modification 2 of the first embodiment.

Then, as shown in FIGS. 14A and 14B, the interlayer insulating film 31 and the control gate electrode 32 are selectively etched away by an RIE method using a resist mask (not shown in the drawings), to expose a part of the semiconductor substrate 30. Thus, a cylindrical trench (hole) with a diameter of about 60 nm is formed in the stack structure with the interlayer insulating film 31 and the control gate electrode 32.

Then, as shown in FIGS. 15A and 15B, an alumina film with a thickness of about 10 nm is deposited on an inner wall of the trench using the CVD method; the alumina film contains, for example, aluminum and oxygen as main components and serves as a block insulating film 33. Alternatively, the block insulating film 33 may be a silicon oxide film containing, for example, silicon and oxygen as main components. Then, a silicon nitride film with a thickness of about 5 nm is deposited using an ALD method; the silicon nitride film serves as a charge accumulation insulating film 34. Subsequently, a silicon oxide film having a thickness of several nm and serving as a tunnel insulating film 35 is formed. The tunnel insulating film 35 may be a multilayer film such as an ONO structure that is a stack structure with a silicon oxide film, a silicon nitride film, and a silicon oxide film. Thereafter, for example, an amorphous silicon film 36 with a thickness of between 5 nm and 20 nm is deposited on the tunnel insulating film 35 at a low temperature of about 500° C., using $SiH_4$ or $Si_2H_6$ or both of these gases.

Then, as shown in FIGS. 16A and 16B, a short-time and high-temperature thermal treatment such as MSA with a duration of between about 0.1 ms and about 2 s or RTA is carried out between about 700° C. and about 1,000° C. Thus, microcrystals 36a are formed in the amorphous silicon film 36 at a low frequency. At this time, a heating method such as LSA may be used, as is the case with the first embodiment and Modification 1 of the first embodiment. Hence, a partial area of the amorphous silicon film 36 may be microcrystallized or crystallized. Furthermore, if Ge is fed into the amorphous silicon film 36, the microcrystal generation temperature decreases, enabling microcrystals to be formed by annealing at lower temperatures. The microcrystals formed in the amorphous silicon film 36 are microcrystal silicon. However, if the amorphous silicon film 36 comprises Ge, microcrystals Ge and microcrystals SiGe are also formed.

Then, as shown in FIGS. 17A and 17B, the amorphous silicon film 36 comprising the crystals 36a is irradiated with microwaves to increase the temperature of the substrate to about 200° C. to about 600° C. (preferably about 200° C. to about 400° C.). Thus, the microwaves are used to carry out annealing for between about 5 minutes and about 2 hours. The microwave annealing allows the amorphous silicon film 36 to be crystallized using the microcrystals 36a as nuclei. Thus, a polycrystalline channel silicon film (polycrystalline silicon film) 36b is formed which is an aggregate of crystals with a grain size of between 50 nm and about 1 μm.

Then, the RIE method using a resist mask (not shown in the drawings) is used to selectively etch away the surfaces of the block insulating film 33, charge accumulation insulating film 34, tunnel insulating film 35, and polycrystalline channel silicon film 36b formed on the semiconductor substrate 30 and the surface of the semiconductor substrate 30. Thereafter, a wiring layer and the like (not shown in the drawings) are formed using a well-known technique, to complete a nonvolatile semiconductor memory device.

According to the above-described Modification 2 of the first embodiment, the amorphous silicon film 36 is annealed at high temperatures for a short time to form the microcrystals 36a in the amorphous silicon film 36 at a low frequency, as is the case with the first embodiment and Modification 1 of the first embodiment. Thereafter, the amorphous silicon film 36 comprising the microcrystals 36a is annealed at a low temperature of between 200° C. and 600° C. using microwaves. The amorphous silicon film 36 is thus crystallized using the microcrystals 36a as nuclei. The crystallized silicon has a grain size of between about 50 nm and about 1 µm. Thus, the microcrystals have a density of $10^8/cm^2$ and $10^{11}/cm^2$.

Hence, the amorphous silicon film 36 can be crystallized at high temperatures in a short time. Furthermore, a nonvolatile semiconductor memory device with a three-dimensional structure can be formed at a high throughput; the three-dimensional structure comprises a high-quality polycrystalline silicon film with an appropriate shape and a reduced resistance.

Additionally, if the amorphous silicon film 36 is crystallized using microcrystals Ge or SiGe as nuclei, the crystals are grown faster than in conventional lamp annealing or furnace annealing. Therefore, the throughput is further increased, and a low-cost semiconductor device can be provided.

Second Embodiment

In the above-described first embodiment, microcrystals are formed in an amorphous silicon film, and irradiated with microwaves to form a polycrystalline silicon film. In the second embodiment, a method will be described in which a polycrystalline silicon film is formed by forming microcrystals Ge, forming an amorphous silicon film over the microcrystals Ge, and irradiating the microcrystals with microwaves.

A method for manufacturing a semiconductor device according to the second embodiment will be described in brief with reference to FIG. 18 to FIG. 21. FIG. 18 to FIG. 21 are sectional views schematically showing a method for forming polycrystalline channel Si in a thin film transistor (TFT).

First, as shown in FIG. 18, microcrystals Ge that are microcrystals 41a with a grain size of at most 1 nm are formed on a surface of an insulating foundation, specifically a substrate (glass substrate) 40 by CVD at about 500° C. using $GeH_4$ diluted with $N_2$, Ar, or the like. In this case, the partial pressure of $GeH_4$ is set to between 0.1 mTorr and 10 mTorr. This allows the microcrystals Ge to be formed at a density of between $10^6/cm^2$ and $10^{11}/cm^2$.

Then, as shown in FIG. 19, an amorphous silicon film 41 with a thickness of between about 50 nm and about 100 nm is deposited on the substrate 40 and microcrystals 41a at about 500° C. using $SiH_4$ or $Si_2H_6$ or both of these gases.

Then, as shown in FIG. 20, the amorphous silicon film 41 comprising the crystals 41a is irradiated with microwaves to increase the temperature of the substrate to about 200° C. to about 600° C. (preferably about 200° C. to about 400° C.). Thus, the microwaves are used to carry out annealing for between about 5 minutes and about 2 hours. The microwave annealing allows the amorphous silicon film 41 to be crystallized using the microcrystals 41a as nuclei. Thus, a polycrystalline channel silicon film (polycrystalline silicon film) 41b is formed which is an aggregate of crystals with a grain size of between 50 nm and about 10 µm.

The frequency of the microwaves is desirably 2.45 GHz, 5.80 GHz, or 24.125 GHz, which is specified as a band. This is because of the availability of a magnetron or the like which generates microwaves, which is inexpensive. Furthermore, the microwaves used have a given frequency width, and 2.45 GHz, 5.80 GHz, and 24.125 GHz, described above, are each included in the frequency width of the microwaves used.

Then, as shown in FIG. 21, a TFT according to the second embodiment can be formed through well-known steps, that is, the steps of forming a gate insulating film 42, a gate electrode 43, a source drain diffusion layer 43c, and the like.

According to the above-described second embodiment, the microcrystals 41a (microcrystals Ge) with the small grain size are formed at a low frequency, and the amorphous silicon film 41 is formed on the microcrystals 41a. Thereafter, as is the case with the first embodiment, the amorphous silicon film 41 comprising the microcrystals 41a is annealed at a low temperature of between 200° C. and 600° C. using microwaves. Thus, the amorphous silicon film 41 is crystallized using the microcrystals 41a as nuclei.

Furthermore, since the amorphous silicon film 41 is crystallized using the microcrystals Ge as nuclei, the crystals are grown faster than in conventional lamp annealing or furnace annealing.

As described above, when annealing is carried out at the low temperature using microwaves, the formation of nuclei in the amorphous silicon can be suppressed to allow appropriately shaped crystals to be formed. Thus, appropriate interfaces (grain boundaries) are formed between the crystals to reduce the electric resistance in the polycrystalline silicon. Furthermore, the low-temperature annealing also allows a possible decrease in withstand voltage in peripheral transistors to be suppressed. Moreover, since the microcrystals 41a are formed at a low frequency, the crystals in the polycrystalline channel silicon film 41b have an increased grain size. This enables a reduction in the number of grain boundaries in the polycrystalline channel silicon film 41b and thus in the electric resistance of the polycrystalline channel silicon film 41b. Furthermore, the use of the microwave annealing allows the amorphous silicon film 41 to be crystallized in a short time.

Thus, as is the case with the first embodiment, the amorphous silicon film 41 can be crystallized at low temperatures in a short time. Therefore, a semiconductor device comprising a high-quality polycrystalline silicon film with an appropriate shape and reduced resistance can be formed at a high throughput.

(Modification 1)

In the method described above in the second embodiment, microcrystals Ge are formed, and an amorphous silicon film is formed on the microcrystals Ge. Then, the microcrystals are irradiated with microwaves to form a polycrystalline silicon film in the planar structure. In Modification 1 of the second embodiment, a method will be described in which high-quality polycrystal is formed in a hole structure using the method for manufacturing a polycrystalline silicon film according to the embodiment.

A method for manufacturing a semiconductor device according to Modification 1 of the second embodiment will be described in brief with reference to FIG. 22 to FIG. 29. FIG. 22 to FIG. 29 are sectional views schematically showing the method for manufacturing a semiconductor device according to Modification 1 of the second embodiment.

First, as shown in FIG. 22, an SiN stopper film (not shown in the drawings) is formed on an electrode 50 formed of polycrystalline silicon or metal or metal silicide on a silicon substrate (not shown in the drawings). $SiO_2$ and Si are stacked on the SiN stopper film a number of times to form a stack structure 51.

Then, as shown in FIG. 23, for example, a hole (opening) is formed in the stack structure 51 using, for example, RIE, to expose a surface of the electrode 50.

Then, as shown in FIG. 24, an $SiO_2$ film is deposited in the hole, and an SiN film is deposited on the $SiO_2$ film. A surface of the SiN film is oxidized to form an insulating film 52 of an ONO structure in which an oxide film, a nitride film, and an oxide film are stacked.

Then, as shown in FIG. 25, microcrystals Ge that are microcrystals 53a with a grain size of at most 1 nm are formed by CVD at about 500° C. using $GeH_4$ diluted with $N_2$, Ar, or the like. In this case, the partial pressure of $GeH_4$ is set to between 0.1 mTorr and 10 mTorr. This allows the microcrystals Ge to be formed at a density of between $10^8/cm^2$ and $10^{11}/cm^2$.

Then, as shown in FIG. 26, an amorphous silicon film 53 with a thickness of between about 5 nm and about 10 nm is deposited on the insulating film 52 and microcrystals 53a at, for example, about 500° C. using $SiH_4$ or $Si_2H_6$ or both of these gases.

Then, as shown in FIG. 27, the amorphous silicon film 53 comprising the crystals 53a is irradiated with microwaves to increase the temperature of the substrate to about 200° C. to about 600° C. (preferably about 200° C. to about 400° C.). Thus, the microwaves are used to carry out annealing for between about 5 minutes and about 2 hours. The microwave annealing allows the amorphous silicon film 53 to be crystallized using the microcrystals 53a as nuclei. Thus, a polycrystalline channel silicon film (polycrystalline silicon film) 53b is formed which is an aggregate of crystals with a grain size of between 50 nm and about 1 μm.

Then, as shown in FIG. 28, an SiN film 54 is deposited all over the resulting surface so as to be buried in the hole structure formed by the polycrystalline channel silicon film 53b.

Then, as shown in FIG. 29, extra portions of the SiN film 54, the polycrystalline channel silicon film 53b, and the insulating film 52 are removed by RIE or the like until the top surface of the stack structure 51 is exposed. In this manner, the high-quality polycrystalline channel silicon film 53b is formed in the hole in the stack structure 51.

According to the above-described Modification 1 of the second embodiment, the microcrystals 53a (microcrystals Ge) with the small grain size are formed at a low frequency, and the amorphous silicon film 53 is formed on the microcrystals 53a, as is the case with the second embodiment. Thereafter, as is the case with the second embodiment, the amorphous silicon film 53 comprising the microcrystals 53a is annealed at a low temperature of between 200° C. and 600° C. using microwaves. Thus, the amorphous silicon film 53 is crystallized using the microcrystals 53a as nuclei.

Furthermore, as is the case with the second embodiment, since the amorphous silicon film 53 is crystallized using the microcrystals Ge as nuclei, the crystals are grown faster than in conventional lamp annealing or furnace annealing.

Thus, the amorphous silicon film 53 can be crystallized at low temperatures in a short time. Therefore, a high-quality polycrystalline silicon film with an appropriate shape and reduced resistance can be formed in the hole in the stack structure 51 at a high throughput.

(Modification 2)

In Modification 2 of the second embodiment, a method will be described in which a polycrystalline channel silicon film is formed in a nonvolatile semiconductor memory device with a three-dimensional structure that uses the three-dimensional stacking technique called BiCS.

With reference to FIGS. 30A and 30B to FIGS. 34A and 34B, a basic method for manufacturing a semiconductor device according to Modification 2 of the second embodiment will be described in brief.

FIGS. 30A to 34A are sectional views taken along a channel length direction and schematically showing the method for manufacturing a semiconductor device according to Modification 2 of the second embodiment. FIGS. 30B to 34B are plan views taken along a direction perpendicular to the channel length direction and schematically showing a part of the method for manufacturing a semiconductor device according to Modification 2 of the second embodiment.

First, as shown in FIGS. 30A and 30B, a silicon oxide film with a thickness of about 50 nm and a silicon film with a thickness of about 50 nm are alternately deposited on a surface of a semiconductor substrate 60 a desired number of times using the CVD method; the silicon oxide film serves as an interlayer insulating film 61, and the silicon film comprises impurities doped therein and serves as a control gate electrode 62. For example, a metal material such as tantalum nitride may be used as the control gate electrode 62.

Figure 31B:
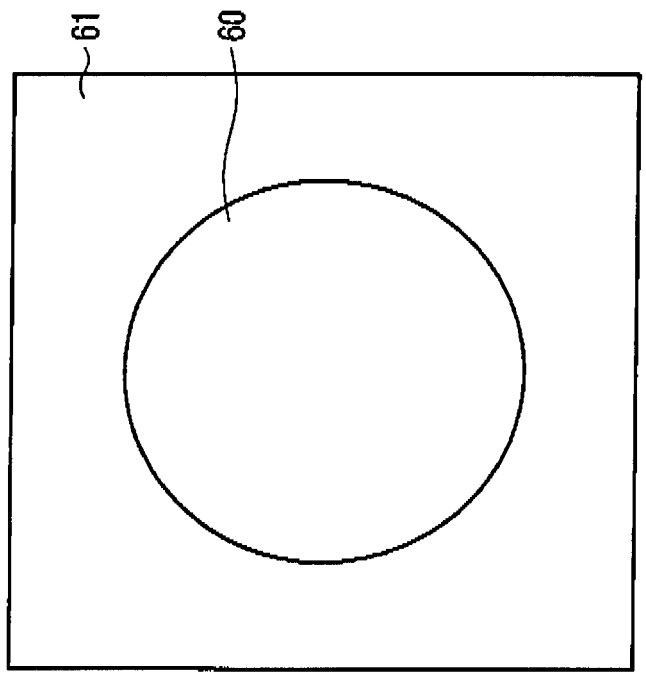
FIG. 31B is a sectional view schematically showing a part of the basic method for manufacturing a semiconductor device according to Modification 2 of the second embodiment.
Figure 31A:
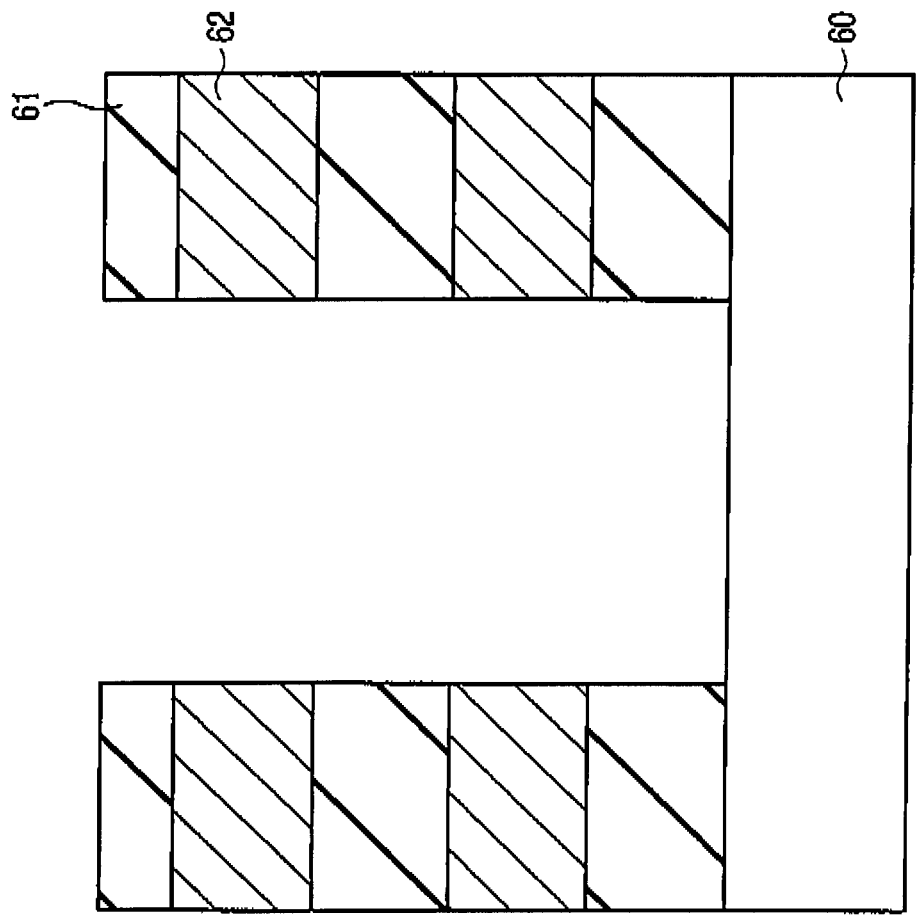
FIG. 31A is a sectional view schematically showing a part of the basic method for manufacturing a semiconductor device according to Modification 2 of the second embodiment.

Then, as shown in FIGS. 31A and 31B, the interlayer insulating film 61 and the control gate electrode 62 are selectively etched away by the RIE method using a resist mask (not shown in the drawings), to expose a part of the semiconductor substrate 60. Thus, a cylindrical trench (hole) with a diameter of about 60 nm is formed in the stack structure with the interlayer insulating film 61 and the control gate electrode 62.

Figure 32B:
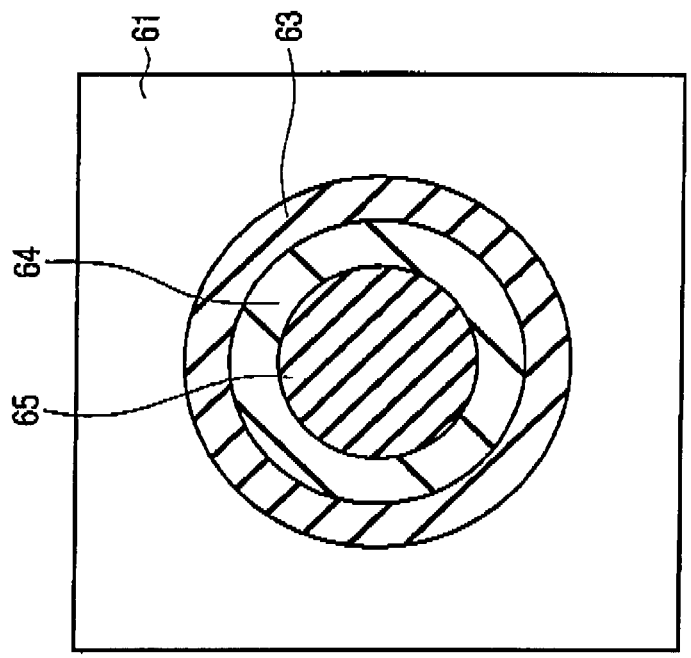
FIG. 32B is a sectional view schematically showing a part of the basic method for manufacturing a semiconductor device according to Modification 2 of the second embodiment.
Figure 32A:
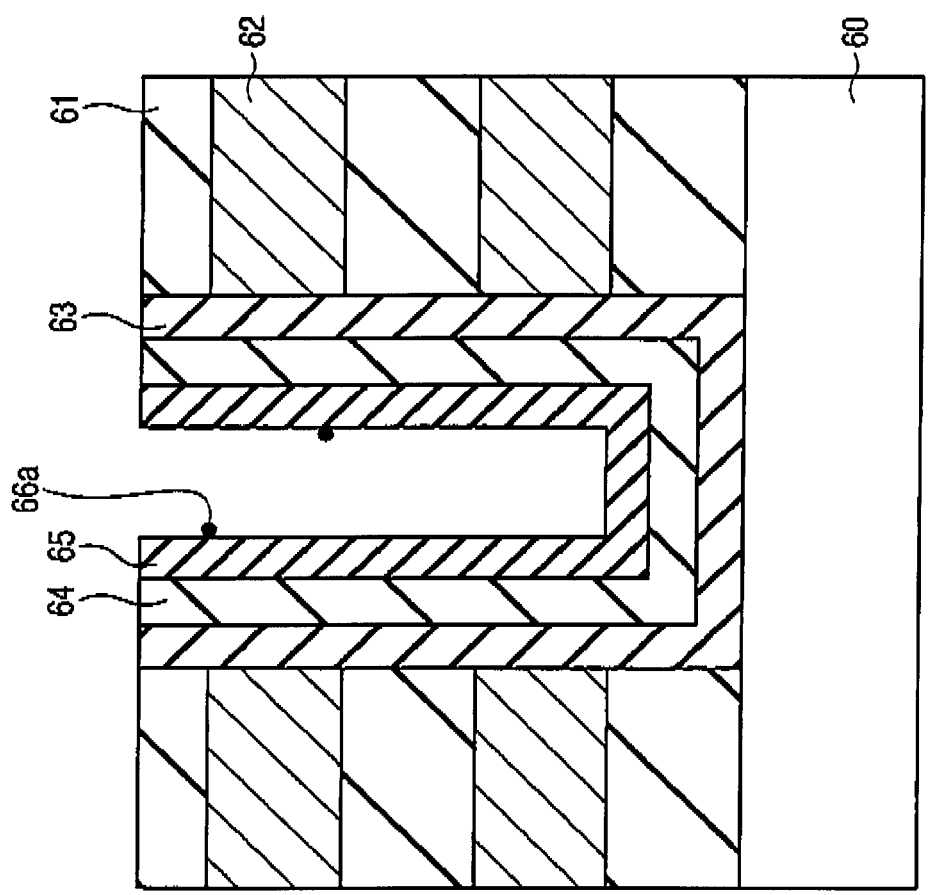
FIG. 32A is a sectional view schematically showing a part of the basic method for manufacturing a semiconductor device according to Modification 2 of the second embodiment.

Then, as shown in FIGS. 32A and 32B, an alumina film with a thickness of about 10 nm is deposited on an inner wall of the trench using the CVD method; the alumina film contains, for example, aluminum and oxygen as main components and serves as a block insulating film 63. Alternatively, the block insulating film 63 may be a silicon oxide film containing, for example, silicon and oxygen as main components. Then, a silicon nitride film with a thickness of about 5 nm is deposited using the ALD method; the silicon nitride film serves as a charge accumulation insulating film 64. Subsequently, a silicon oxide film having a thickness of several nm and serving as a tunnel insulating film 65 is formed. The tunnel insulating film 65 may be a multilayer film such as an ONO structure that is a stack structure with a silicon oxide film, a silicon nitride film, and a silicon oxide film. Thereafter, microcrystals Ge that are microcrystals 66a with a grain size of at most 1 nm are formed by CVD at about 500° C. using $GeH_4$ diluted with $N_2$, Ar, or the like. In this case, the partial pressure of $GeH_4$ is set to between 1 mTorr and 10 mTorr. This allows the microcrystals Ge to be formed at a density of between $10^8/cm^2$ and $10^{11}/cm^2$.

Figure 33B:
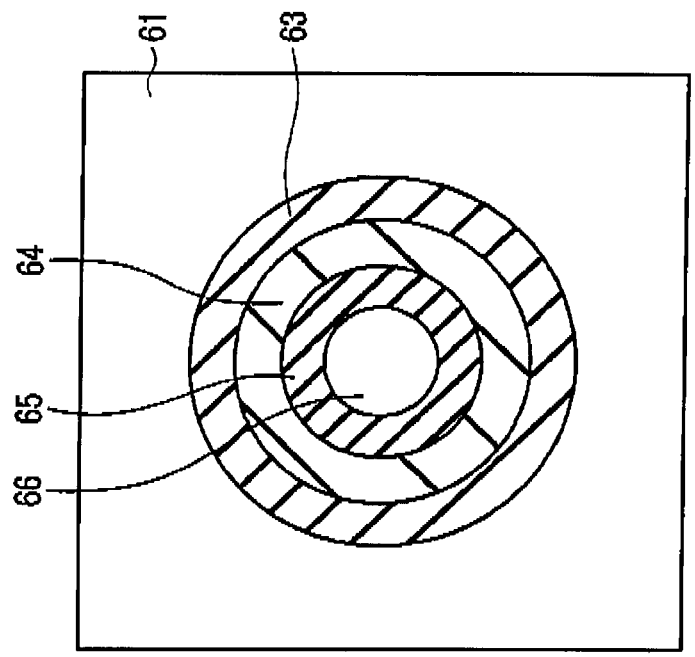
FIG. 33B is a sectional view schematically showing a part of the basic method for manufacturing a semiconductor device according to Modification 2 of the second embodiment.
Figure 33A:
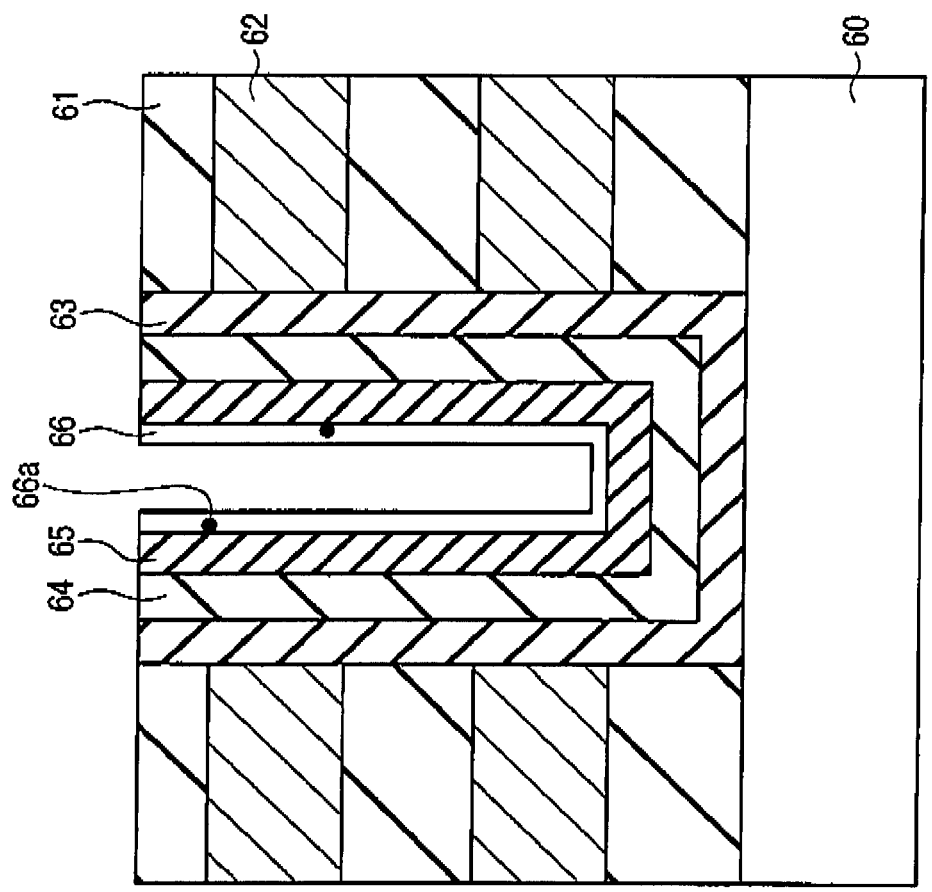
FIG. 33A is a sectional view schematically showing a part of the basic method for manufacturing a semiconductor device according to Modification 2 of the second embodiment.

Then, as shown in FIGS. 33A and 33B, an amorphous silicon film 66 with a thickness of between about 5 nm and about 10 nm is deposited on the tunnel insulating film 65 and microcrystals 66a at, for example, about 500° C. using $SiH_4$ or $Si_2H_6$ or both of these gases.

Then, as shown in FIGS. 34A and 34B, the amorphous silicon film 66 comprising the crystals 66a is irradiated with microwaves to increase the temperature of the substrate to about 200° C. to about 600° C. (preferably about 200° C. to about 400° C.). Thus, the microwaves are used to carry out annealing for between about 5 minutes and about 2 hours. The microwave annealing allows the amorphous silicon film 66 to be crystallized using the microcrystals 66a as nuclei. Thus, a polycrystalline channel silicon film (polycrystalline silicon film) 66b is formed which is an aggregate of crystals with a grain size of between 50 nm and about 1 μm.

Then, the RIE method using a resist mask (not shown in the drawings) is used to selectively etch away the surfaces of the block insulating film 63, charge accumulation insulating film 64, tunnel insulating film 65, and polycrystalline channel silicon film 66b formed on the semiconductor substrate 60 and the surface of the semiconductor substrate 60. Thereafter, a wiring layer and the like (not shown in the drawings) are formed using a well-known technique, to complete a nonvolatile semiconductor memory device.

According to the above-described Modification 2 of the second embodiment, the microcrystals 66a (microcrystals Ge) with the small grain size are formed at a low frequency and the amorphous silicon film 66 is formed on the microcrystals 66a, as is the case with the second embodiment and Modification 1 of the second embodiment. Thereafter, the amorphous silicon film 66 comprising the microcrystals 66a is annealed at a low temperature of between 200° C. and 600° C. using microwaves. The amorphous silicon film 36 is thus crystallized using the microcrystals 66a as nuclei.

Furthermore, as is the case with the second embodiment and Modification 1 of the second embodiment, since the amorphous silicon film 66 is crystallized using the microcrystals Ge as nuclei, the crystals are grown faster than in conventional lamp annealing or furnace annealing.

Thus, the amorphous silicon film 66 can be crystallized at low temperatures in a short time. Therefore, a nonvolatile semiconductor memory device comprising a high-quality polycrystalline silicon film with an appropriate shape and reduced resistance can be formed at a high throughput.

An increase in the density of the microcrystals enables an increase in the size of grains in the polycrystalline silicon film formed by the microwave annealing. This in turn enables a further reduction in the resistance of the polycrystalline silicon film.

Furthermore, an example of the three-dimensional structure using BiCS is described above in Modification 2 of the first embodiment and Modification 2 of the second embodiment. However, the present invention is not limited to this configuration. The present invention is applicable to a three-dimensional structure that is a stack structure comprising an interlayer insulating film, a control gate electrode, and a U-shaped opening.

Additionally, the above-described temperatures have been measured using, for example, a pyrometer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, comprising:
    forming a semi-amorphous semiconductor film, comprising a microcrystal, above a substrate; and
    irradiating microwaves to the semi-amorphous semiconductor film to increase a temperature of the substrate to between 200° C. and 400° C., to crystallize the semi-amorphous semiconductor film comprising the microcrystal using the microcrystal as a nucleus.

2. The method according to claim 1, wherein the semi-amorphous semiconductor film comprising the microcrystal is formed by thermally treating the semi-amorphous semiconductor film to partly crystallize the semi-amorphous semiconductor film.

3. The method according to claim 2, wherein a treatment time for the thermal treatment is between 0.1 ms and 2 s.

4. The method according to claim 2, wherein a temperature for the thermal treatment is between 700° C. and 1,000° C.

5. The method according to claim 2, wherein the thermal treatment is carried out by MSA or RTA.

6. The method according to claim 1, wherein the semi-amorphous semiconductor film comprising the microcrystal is formed by depositing the semi-amorphous semiconductor film above the substrate with a microcrystal comprising Ge.

7. The method according to claim 6, wherein the microcrystal comprising the Ge is formed using CVD.

8. The method according to claim 7, wherein the microcrystal comprising the Ge has a grain size of at most 1 nm.

9. The method according to claim 7, wherein the CVD uses GeH with a partial pressure of between 0.1 mTorr and 10 mTorr.

10. The method according to claim 1, wherein the microcrystal comprises Ge.

11. The method according to claim 1, wherein the semi-amorphous semiconductor film comprising the microcrystal comprises Si and Ge.

12. The method according to claim 1, wherein a treatment time for the annealing using the microwave is between 5 minutes and 2 hours.

13. The method according to claim 1, wherein crystallization of the semi-amorphous semiconductor film results in an aggregate of crystals with a grain size of between 50 nm and 10 μm.

14. The method according to claim 1, wherein the semi-amorphous semiconductor film comprising the microcrystal is formed on a flat surface.

15. The method according to claim 1, wherein the semi-amorphous semiconductor film comprising the microcrystal is formed in a hole in a substrate.

* * * * *